| (12) | United States Patent<br>Hafez et al. | (10) Patent No.: US 10,950,606 B2<br>(45) Date of Patent: Mar. 16, 2021 |
|---|---|---|

(54) DUAL FIN ENDCAP FOR SELF-ALIGNED GATE EDGE (SAGE) ARCHITECTURES

(71) Applicant: Intel Corporation, Santa Clara, CA (US)

(72) Inventors: Walid M. Hafez, Portland, OR (US); Roman W. Olac-Vaw, Hillsboro, OR (US); Chia-Hong Jan, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 65 days.

(21) Appl. No.: 16/318,316

(22) PCT Filed: Sep. 30, 2016

(86) PCT No.: PCT/US2016/054896
§ 371 (c)(1),
(2) Date: Jan. 16, 2019

(87) PCT Pub. No.: WO2018/063365
PCT Pub. Date: Apr. 5, 2018

(65) Prior Publication Data
US 2019/0287972 A1 Sep. 19, 2019

(51) Int. Cl.
*H01L 27/092* (2006.01)
*H01L 21/768* (2006.01)
(Continued)

(52) U.S. Cl.
CPC .... *H01L 27/0924* (2013.01); *H01L 21/76895* (2013.01); *H01L 21/823431* (2013.01);
(Continued)

(58) Field of Classification Search
CPC ......... H01L 21/823431; H01L 27/0886; H01L 21/823481; H01L 21/823462;
(Continued)

(56) References Cited

U.S. PATENT DOCUMENTS

2007/0080380 A1 4/2007 Chang
2012/0286337 A1 11/2012 Liang et al.
(Continued)

OTHER PUBLICATIONS

International Preliminary Report on Patentability for International Patent Application No. PCT/US2016/054896 dated Apr. 11, 2019, 9 pgs.
(Continued)

*Primary Examiner* — Thanhha S Pham
(74) *Attorney, Agent, or Firm* — Schwabe, Williamson & Wyatt, P.C.

(57) ABSTRACT

Dual fin endcaps for self-aligned gate edge architectures, and methods of fabricating dual fin endcaps for self-aligned gate edge architectures, are described. In an example, a semiconductor structure includes an I/O device having a first plurality of semiconductor fins disposed above a substrate and protruding through an uppermost surface of a trench isolation layer. A logic device having a second plurality of semiconductor fins is disposed above the substrate and protrudes through the uppermost surface of the trench isolation layer. A gate edge isolation structure is disposed between the I/O device and the logic device. A semiconductor fin of the first plurality of semiconductor fins closest to the gate edge isolation structure is spaced farther from the gate edge isolation structure than a semiconductor fin of the second plurality of semiconductor fins closest to the gate edge isolation structure.

27 Claims, 12 Drawing Sheets

(51) Int. Cl.
*H01L 21/8238* (2006.01)
*H01L 29/66* (2006.01)
*H01L 29/78* (2006.01)
*H01L 27/088* (2006.01)
*H01L 23/48* (2006.01)
*H01L 29/06* (2006.01)
*H01L 21/8234* (2006.01)
*H01L 29/417* (2006.01)

(52) U.S. Cl.
CPC ........ *H01L 21/823462* (2013.01); *H01L 21/823481* (2013.01); *H01L 21/823821* (2013.01); *H01L 21/823857* (2013.01); *H01L 21/823871* (2013.01); *H01L 21/823878* (2013.01); *H01L 23/481* (2013.01); *H01L 27/0886* (2013.01); *H01L 29/06* (2013.01); *H01L 29/0649* (2013.01); *H01L 29/417* (2013.01); *H01L 29/66* (2013.01); *H01L 29/66545* (2013.01); *H01L 29/66795* (2013.01); *H01L 29/78* (2013.01); *H01L 29/785* (2013.01); *H01L 21/823475* (2013.01)

(58) Field of Classification Search
CPC ....... H01L 21/76895; H01L 21/823821; H01L 21/823857; H01L 27/0924; H01L 29/785; H01L 29/66795
See application file for complete search history.

(56) References Cited

U.S. PATENT DOCUMENTS

2013/0175611 A1* 7/2013 Shinohara ........... H01L 27/0924
257/334
2015/0236134 A1 8/2015 Zhong et al.
2015/0371896 A1 12/2015 Chen et al.
2016/0086947 A1* 3/2016 Park ..................... H01L 27/092
257/369
2016/0233298 A1 8/2016 Webb et al.

OTHER PUBLICATIONS

International Search Report and Written Opinion for International Patent Application No. PCT/US2016/054896 dated Jun. 21, 2017, 12pgs.
Office Action and Search Report for Taiwan Patent Application No. 106128297 dated Dec. 30, 2020, 6 pgs, no translation.

* cited by examiner

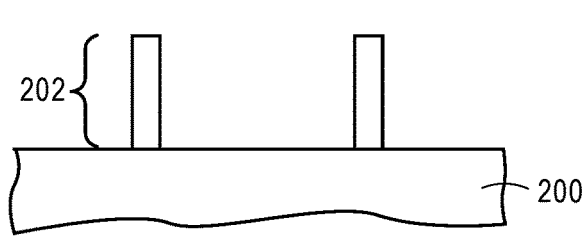
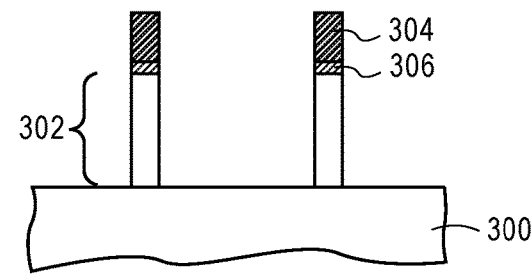
FIG. 2A   FIG. 3A
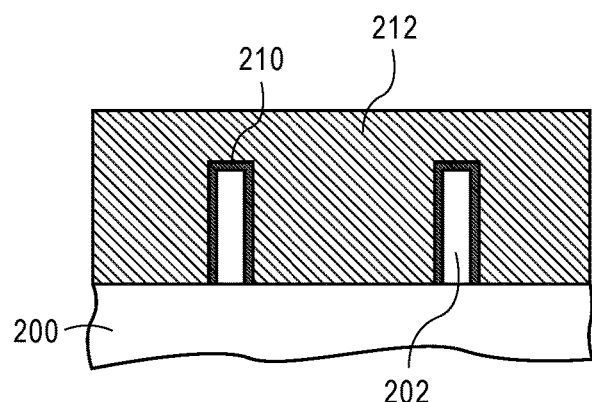
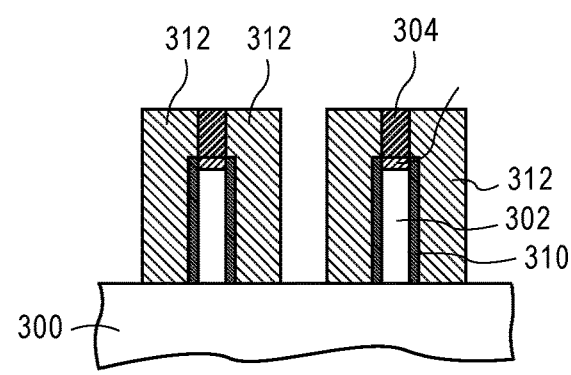
FIG. 2B   FIG. 3B

DUAL FIN ENDCAP FOR SELF-ALIGNED GATE EDGE (SAGE) ARCHITECTURES

CROSS-REFERENCE TO RELATED APPLICATION

This patent application is a U.S. National Phase Application under 35 U.S.C. § 371 of International Application No. PCT/US2016/054896, filed Sep. 30, 2016, entitled "DUAL FIN ENDCAP FOR SELF-ALIGNED GATE EDGE (SAGE) ARCHITECTURES," which designates the United States of America, the entire disclosure of which is hereby incorporated by reference in its entirety and for all purposes.

TECHNICAL FIELD

Embodiments of the invention are in the field of semiconductor devices and processing and, in particular, dual fin endcaps for self-aligned gate edge architectures and methods of fabricating dual fin endcaps for self-aligned gate edge architectures.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

In the manufacture of integrated circuit devices, multi-gate transistors, such as tri-gate transistors, have become more prevalent as device dimensions continue to scale down. In conventional processes, tri-gate transistors are generally fabricated on either bulk silicon substrates or silicon-on-insulator substrates. In some instances, bulk silicon substrates are preferred due to their lower cost and because they enable a less complicated tri-gate fabrication process.

Scaling multi-gate transistors has not been without consequence, however. As the dimensions of these fundamental building blocks of microelectronic circuitry are reduced and as the sheer number of fundamental building blocks fabricated in a given region is increased, the constraints on the lithographic processes used to pattern these building blocks have become overwhelming. In particular, there may be a trade-off between the smallest dimension of a feature patterned in a semiconductor stack (the critical dimension) and the spacing between such features.

BRIEF DESCRIPTION OF THE DRAWINGS

FIGS. 2A-2D illustrate cross-sectional views of process operations of significance in a conventional finFET or tri-gate process fabrication scheme.

FIGS. 3A-3D illustrate cross-sectional views of process operations of significance in a self-aligned gate edge process fabrication scheme for finFET or tri-gate devices.

DESCRIPTION OF THE EMBODIMENTS

Figure 1:
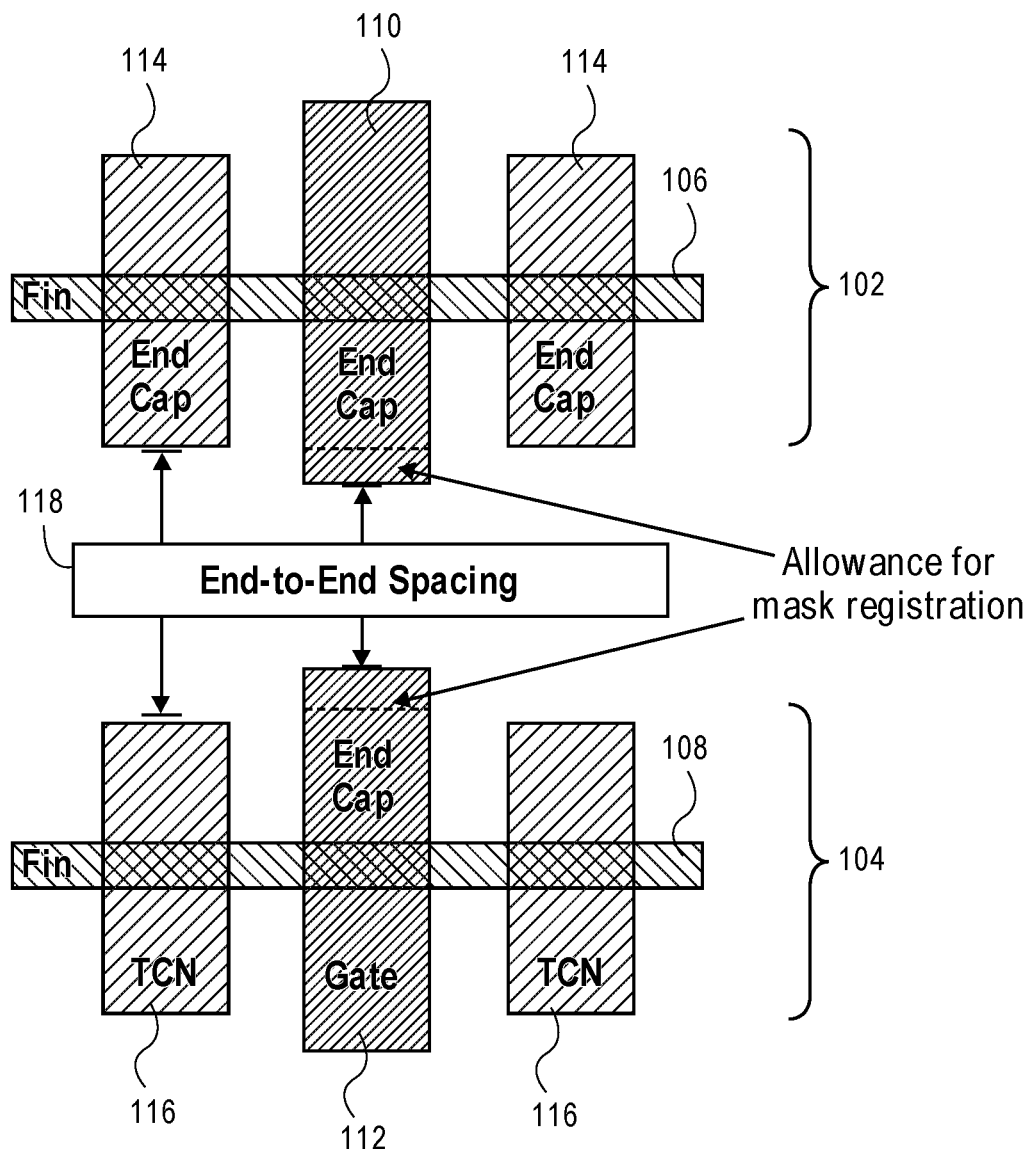
FIG. 1 illustrates a plan view of a layout including fin-based semiconductor devices accommodating end-to-end spacing.

Dual fin endcaps for self-aligned gate edge architectures, and methods of fabricating dual fin endcaps for self-aligned gate edge architectures, are described. In the following description, numerous specific details are set forth, such as specific integration and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

One or more embodiments of the present invention are directed to semiconductor structures or devices having one or more gate edge structures (e.g., as gate isolation regions) of gate electrodes of the semiconductor structures or devices. One or more embodiments are directed to the fabrication of local interconnects for such gate electrode structures. Additionally, methods of fabricating gate edge isolation structures in a self-aligned manner are also described. In one or more embodiments, self-aligned gate edge structures are fabricated for logic transistors and high voltage transistors formed on a common substrate.

System-on-chip (SoC) process technologies typically require support of standard logic (e.g., low voltage, thin-oxide) and I/O (e.g., high voltage, thick-oxide) transistors. The distinction between standard logic and high voltage (HVI/O) devices may be accomplished through a multi-oxide process sequence, where logic transistors receive a thin, high-performance oxide and I/O devices receive a thick oxide capable to sustain higher voltages. As process technologies scale, the logic devices aggressively scale in dimension, creating fabrication challenges with dual-oxide formation. In accordance with one or more embodiments of the present invention, methods of forming a high voltage/ dual endcap process on an ultra-scaled finfet transistor architecture by using a self-aligned endcap is described below.

To provide context, scaling of gate endcap and trench contact (TCN) endcap regions are important contributors towards improving transistor layout area and density. Gate and TCN endcap regions refer to gate and TCN overlap of the diffusion region/fins of semiconductor devices. As an example, FIG. 1 illustrates a plan view of a layout 100 including fin-based semiconductor devices accommodating end-to-end spacing. Referring to FIG. 1, first 102 and second 104 semiconductor devices are based on semiconductor fins 106 and 108, respectively. Each device 102 and 104 has a gate electrode 110 or 112, respectively. Additionally, each device 102 and 104 has trench contacts (TCNs) 114 and 116, respectively, at source and drain regions of the fins 106 and 108, respectively. The gate electrodes 110 and 112 and the TCNs 114 and 116 each have an end cap region, which is located off of the corresponding fins 106 and 108, respectively.

Referring again to FIG. 1, typically, gate and TCN endcap dimensions must include an allowance for mask registration error to ensure robust transistor operation for worst case mask mis-registration, leaving an end-to-end spacing 118. Thus, another important design rule critical to improving transistor layout density is the spacing between two adjacent endcaps facing each other. However, the parameters of "2*Endcap+End-to-End Spacing" are becoming increasingly difficult to scale using lithographic patterning to meet the scaling requirements for new technologies. In particular, the additional endcap length required to allow for mask registration error also increases gate capacitance values due to longer overlap length between TCN and gate electrodes, thereby increasing product dynamic energy consumption and degrading performance. Previous solutions have focused on improving registration budget and patterning or resolution improvements to enable shrinkage of both endcap dimension and endcap-to-endcap spacing.

In accordance with an embodiment of the present invention, approaches are described which provide for self-aligned gate endcap and TCN overlap of a semiconductor fin without any need to allow for mask registration. In one such embodiment, a disposable spacer is fabricated on the semiconductor fin edges which determines the gate endcap and the contact overlap dimensions. The spacer defined endcap process enables the gate and TCN endcap regions to be self-aligned to the semiconductor fin and, therefore, does not require extra endcap length to account for mask mis-registration. Furthermore, approaches described herein do not require lithographic patterning at previously required stages since the gate and TCN endcap/overlap dimensions remain fixed, leading to improvement (i.e., reduction) in device to device variability in electrical parameters.

In order to provide a side-by-side comparison, FIGS. 2A-2D illustrate cross-sectional views of process operations of significance in a conventional finFET or tri-gate process fabrication scheme, while FIGS. 3A-3D illustrate cross-sectional views of process operations of significance in a self-aligned gate edge process fabrication scheme for finFET or tri-gate devices, in accordance with an embodiment of the present invention.

Referring to FIGS. 2A and 3A, a bulk semiconductor substrate 200 or 300, such as a bulk single crystalline silicon substrate is provided having fins 202 or 302, respectively, etched therein. In an embodiment, the fins are formed directly in the bulk substrate 200 or 300 and, as such, are formed continuous with the bulk substrate 200 or 300. It is to be appreciated that within the substrate 200 or 300, shallow trench isolation structures may be formed between fins. Referring to FIG. 3A, a hardmask layer 304, such as a silicon nitride hardmask layer, and a pad oxide layer 306, such as a silicon dioxide layer, remain atop fins 302 following patterning to form the fins 302. By contrast, referring to FIG. 2A, such a hardmask layer and pad oxide layer have been removed.

Referring to FIG. 2B, a dummy or permanent gate dielectric layer 210 is formed on the exposed surfaces of the semiconductor fins 202, and a dummy gate layer 212 is formed over the resulting structure. By contrast, referring to FIG. 3B, a dummy or permanent gate dielectric layer 310 is formed on the exposed surfaces of the semiconductor fins 302, and dummy spacers 312 are formed adjacent to the resulting structure.

Figure 2C:
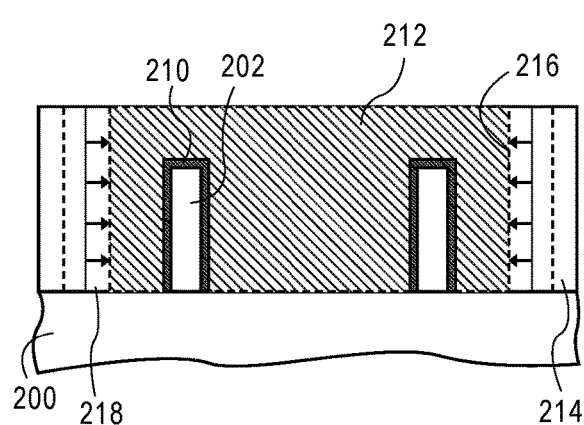

Referring to FIG. 2C, gate endcap cut patterning is performed and isolation regions 214 are formed at the resulting patterned dummy gate ends 216. In the conventional process scheme, a larger gate endcap must be fabricated to allow for gate mask mis-registration, as depicted by the arrowed regions 218. By contrast, referring to FIG. 3C, self-aligned isolation regions 314 are formed by providing an isolation layer over the structure of FIG. 3B, e.g., by deposition and planarization. In one such embodiment, the self-aligned gate endcap process does not require extra space for mask registration, as compared in FIGS. 2C and 3C.

Figure 2D:
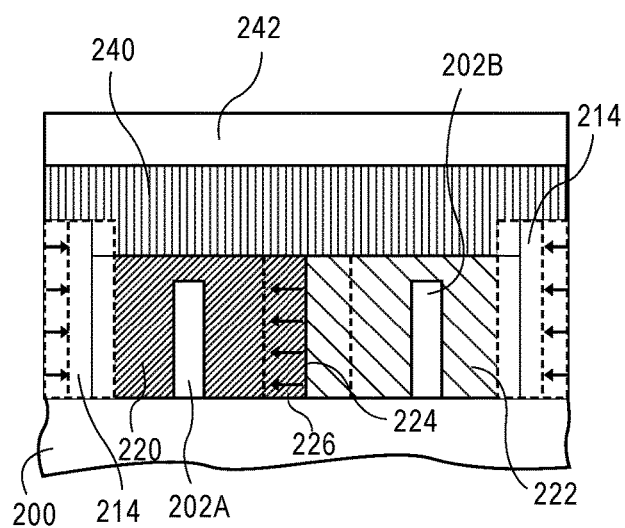

Referring to FIG. 2D, the dummy gate electrode 212 of FIG. 2C is replaced with permanent gate electrodes. In the case of use of a dummy gate dielectric layer, such a dummy gate dielectric layer may also be replaced by a permanent gate dielectric layer in this process. In the specific example shown, a dual metal gate replacement process is performed to provide an N-type gate electrode 220 over a first semiconductor fin 202A and to provide a P-type gate electrode 222 over a second semiconductor fin 202B. The N-type gate electrode 220 and the P-type gate electrode 222 are formed between the gate edge isolations structures 214, but form a P/N junction 224 where they meet. The exact location of the P/N junction 224 may vary, depending on mis-registration, as depicted by the arrowed region 226.

Figure 3C:
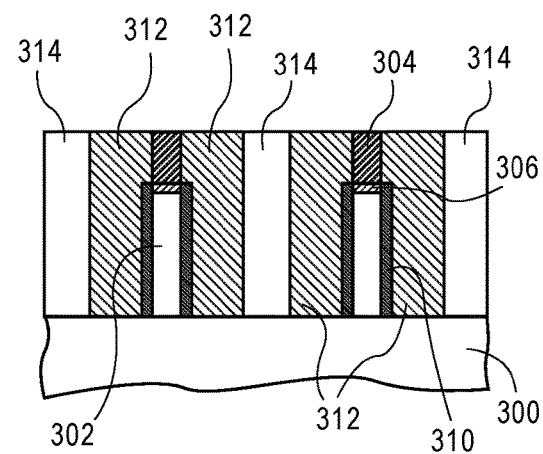
Figure 3D:
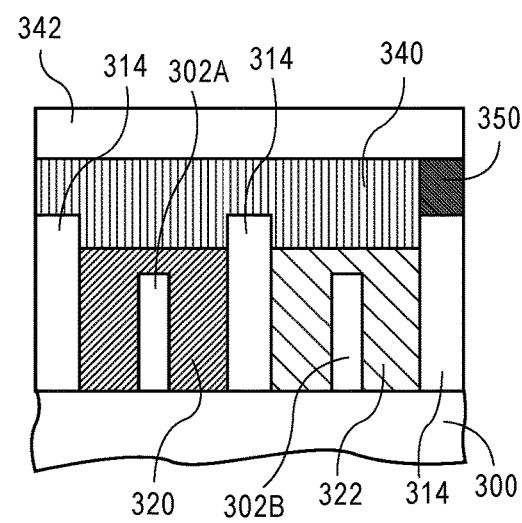

By contrast, referring to FIG. 3D, the hardmask layer 304 and pad oxide layer 306 are removed, and the dummy spacers 314 of FIG. 3C are replaced with permanent gate electrodes. In the case of use of a dummy gate dielectric layer, such a dummy gate dielectric layer may also be replaced by a permanent gate dielectric layer in this process. In the specific example shown, a dual metal gate replacement process is performed to provide an N-type gate electrode 320 over a first semiconductor fin 302A and to provide a P-type gate electrode 322 over a second semiconductor fin 302B. The N-type gate electrode 320 and the P-type gate electrode 322 are formed between, and are also separated by, the gate edge isolations structures 314.

Referring again to FIG. 2D, a local interconnect 240 may be fabricated to contact N-type gate electrode 220 and P-type gate electrode 322 to provide a conductive path around the P/N junction 224. Likewise, referring to FIG. 3D, a local interconnect 340 may be fabricated to contact N-type gate electrode 320 and P-type gate electrode 322 to provide a conductive path over the intervening isolation structure 314 there between. Referring to both FIGS. 2D and 3D, a hardmask 242 or 342 may be formed on the local interconnect 240 or 340, respectively. Referring to FIG. 3D in particular, in an embodiment, the continuity of the local interconnect 340 is interrupted by a dielectric plug 350 in cases where a break in electrical contact along a gate line are needed.

In accordance with one or more embodiments of the present invention, a self-aligned gate endcap (SAGE) processing scheme involves the formation of gate/trench contact endcaps self-aligned to fins without requiring an extra length to account for mask mis-registration. Thus, embodiments may be implemented to enable shrinking of transistor layout area. Furthermore, a flexible fin-height (e.g., multi Hsi) process can enable independent optimization of different cells for power and performance. An integrated process flow enabling both features may be implemented to meet scaling and performance challenges for future CMOS technology. Embodiments described herein may involve the fabrication of gate edge isolation structures, which may also be referred to as gate walls, isolation gate walls or self-aligned gate edge (SAGE) walls.

To provide further context, as technology nodes scale smaller, there is an increasing lack of geometrical space in a narrow-endcap logic device to accommodate a defect-free dual oxide process that may be needed for high-voltage transistor fabrication. Current approaches rely upon a single, unsealed endcap space to accommodate a single logic oxide process. However, such a process may be incompatible with highly scaled geometries supporting a dual-oxide high-voltage SoC technology, since the endcap space may be insufficient to accommodate both oxides (gate dielectrics).

Figure 4:
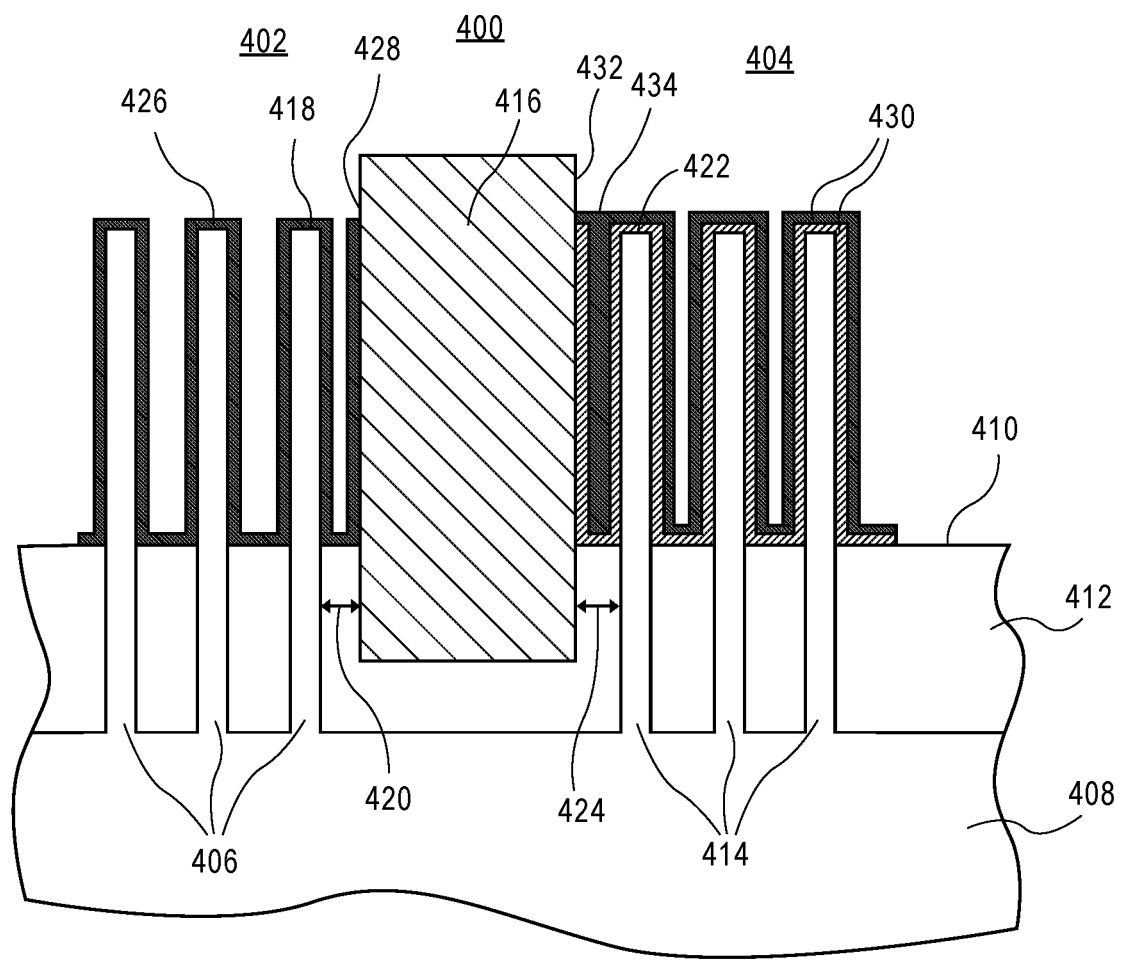
FIG. 4 illustrates a cross-section view of a semiconductor structure having a logic region and a high-voltage (I/O) region separated by a gate edge isolation structure by a same, smaller, spacing.

Demonstrating the above issue, FIG. 4 illustrates a cross-section view of a semiconductor structure having a logic region and a high-voltage (I/O) region separated by a gate edge isolation structure by a same, smaller, spacing.

Referring to FIG. 4, a semiconductor structure 400 includes a logic device or region 402 and an I/O device or region 404. The logic device or region 402 includes a first plurality of semiconductor fins 406 disposed above a substrate 408 and protruding through an uppermost surface 410 of a trench isolation layer 412. The I/O device or region 404 includes a second plurality of semiconductor fins 414 disposed above the substrate 408 and protruding through the uppermost surface 410 of the trench isolation layer 412. A gate edge isolation structure 416 is disposed between the logic device or region 402 and the I/O device or region 404. A semiconductor fin 418 of the first plurality of semiconductor fins 406 closest to the gate edge isolation structure 416 is spaced from the gate edge isolation structure 416 by a distance 420. A semiconductor fin 422 of the second plurality of semiconductor fins 414 closest to the gate edge isolation structure 416 is spaced from the gate edge isolation structure 416 by a distance 424. The distances 420 and 424 are precisely or at least substantially the same.

Referring again to FIG. 4, the logic device or region 402 includes a gate dielectric 426 conformal with the first plurality of semiconductor fins 406 and laterally adjacent to and in contact with a first side 428 of the gate edge isolation structure 416. The I/O device or region 404 includes a gate dielectric 430 conformal with the second plurality of semiconductor fins 414 and laterally adjacent to and in contact with a second side 432 of the gate edge isolation structure 416. The gate dielectric 430 is thicker than the gate dielectric 426 and, in some cases, may include more layers than the gate dielectric 426. Since the distance 424 is relatively small, e.g., due to aggressive dimension scaling, pinch off 434 may occur during deposition of the gate dielectric 430. In locations where such pinch-off occurs, subsequent gate electrode fabrication may be compromised as gate material may not be formed along the sidewall of fin 422 proximate the gate edge isolation structure 416. Accordingly, an aggressively scaled end cap may have insufficient ability to accommodate a thicker oxide needed in a dual-gate SoC process. The resulting likelihood of prohibiting effective high-voltage oxide fill may lead to process defects.

Figure 5:
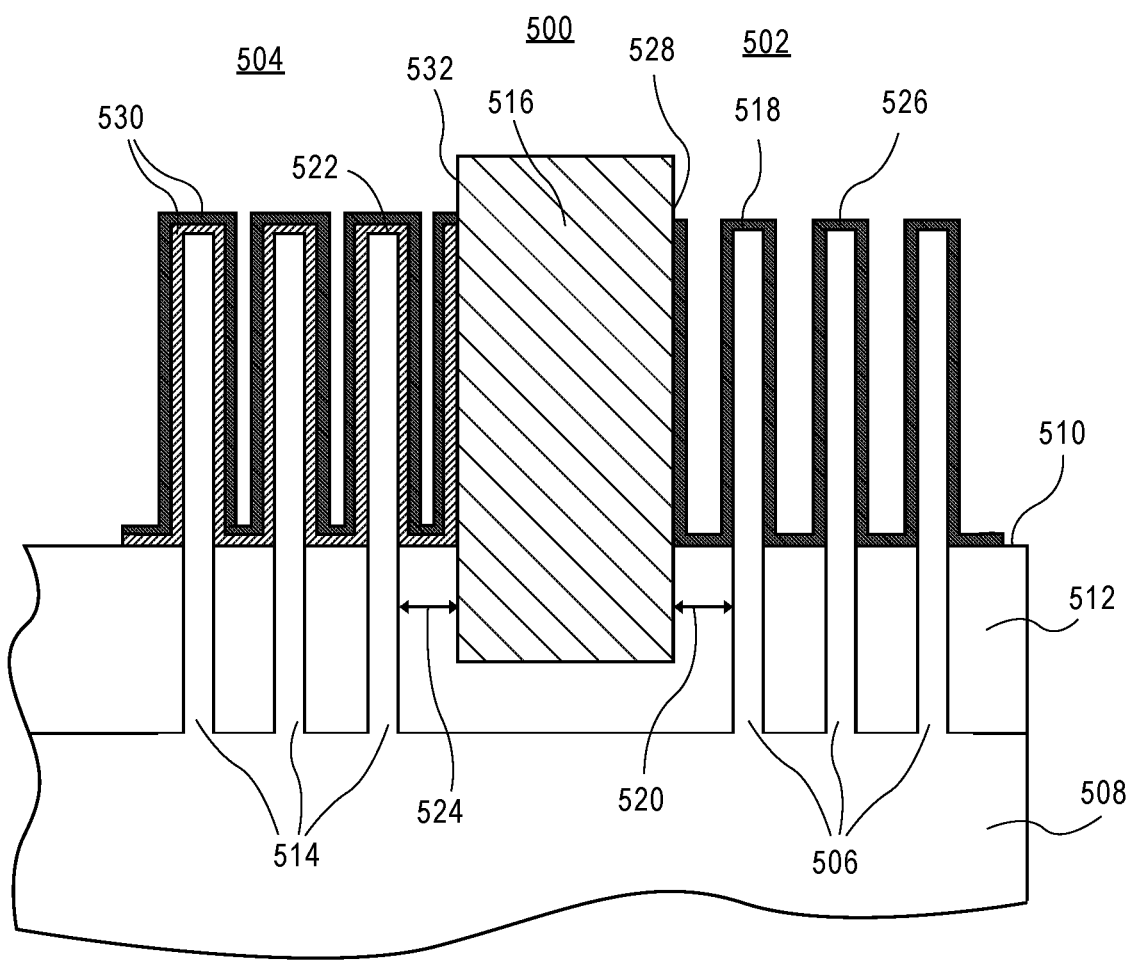
FIG. 5 illustrates a cross-section view of a semiconductor structure having a logic region and a high-voltage (I/O) region separated by a gate edge isolation structure by a same, larger, spacing.

In contrast to FIG. 4, FIG. 5 illustrates a cross-section view of a semiconductor structure having a logic region and a high-voltage (I/O) region separated by a gate edge isolation structure by a same, larger, spacing.

Referring to FIG. 5, a semiconductor structure 500 includes a logic device or region 502 and an I/O device or region 504. The logic device or region 502 includes a first plurality of semiconductor fins 506 disposed above a substrate 508 and protruding through an uppermost surface 510 of a trench isolation layer 512. The I/O device or region 504 includes a second plurality of semiconductor fins 514 disposed above the substrate 508 and protruding through the uppermost surface 510 of the trench isolation layer 512. A gate edge isolation structure 516 is disposed between the logic device or region 502 and the I/O device or region 504. A semiconductor fin 518 of the first plurality of semiconductor fins 506 closest to the gate edge isolation structure 516 is spaced from the gate edge isolation structure 516 by a distance 520. A semiconductor fin 522 of the second plurality of semiconductor fins 514 closest to the gate edge isolation structure 516 is spaced from the gate edge isolation structure 516 by a distance 524. The distances 520 and 524 are precisely or at least substantially the same.

Referring again to FIG. 5, the logic device or region 502 includes a gate dielectric 526 conformal with the first plurality of semiconductor fins 506 and laterally adjacent to and in contact with a first side 528 of the gate edge isolation structure 516. The I/O device or region 504 includes a gate dielectric 530 conformal with the second plurality of semiconductor fins 514 and laterally adjacent to and in contact with a second side 532 of the gate edge isolation structure 516. The gate dielectric 530 is thicker than the gate dielectric 526 and, in some cases, may include more layers than the gate dielectric 526. Since the distance 524 is relatively large, accommodation of the relatively thicker gate dielectric 530 may be achieved without pinch-off. Accordingly, subsequent gate electrode fabrication may be achieved without defect since gate material can form along the sidewall of fin 522 proximate the gate edge isolation structure 516. However, by using larger spacing 520 and 524, aggressive scaling of the end cap is restricted, inhibiting scaling of the logic device or region 502.

In accordance with an embodiment of the present invention, scaling limitation imposed by requirements fill high-voltage gates with both the high-voltage oxide and logic oxide are addressed. In particular, as logic dimensions decrease, the endcap space in high voltage (HV) devices becomes insufficiently narrow to fill both oxides. As described above, current single-endcap SAGE architectures either cannot support dual logic and high-voltage oxide integration, or require the single endcap to be sufficiently wide to accommodate the thicker HV oxide, where logic density is effectively degraded from the wider endcap. In an embodiment, different endcap spaces between logic transistor and high-voltage transistor, respectively, are fabricated in a SAGE architecture. The logic transistor endcap is ultra-scaled by using the self-aligned endcap architecture, while the high-voltage transistor has a wider endcap to accommodate a thicker gate dielectric.

Figure 6:
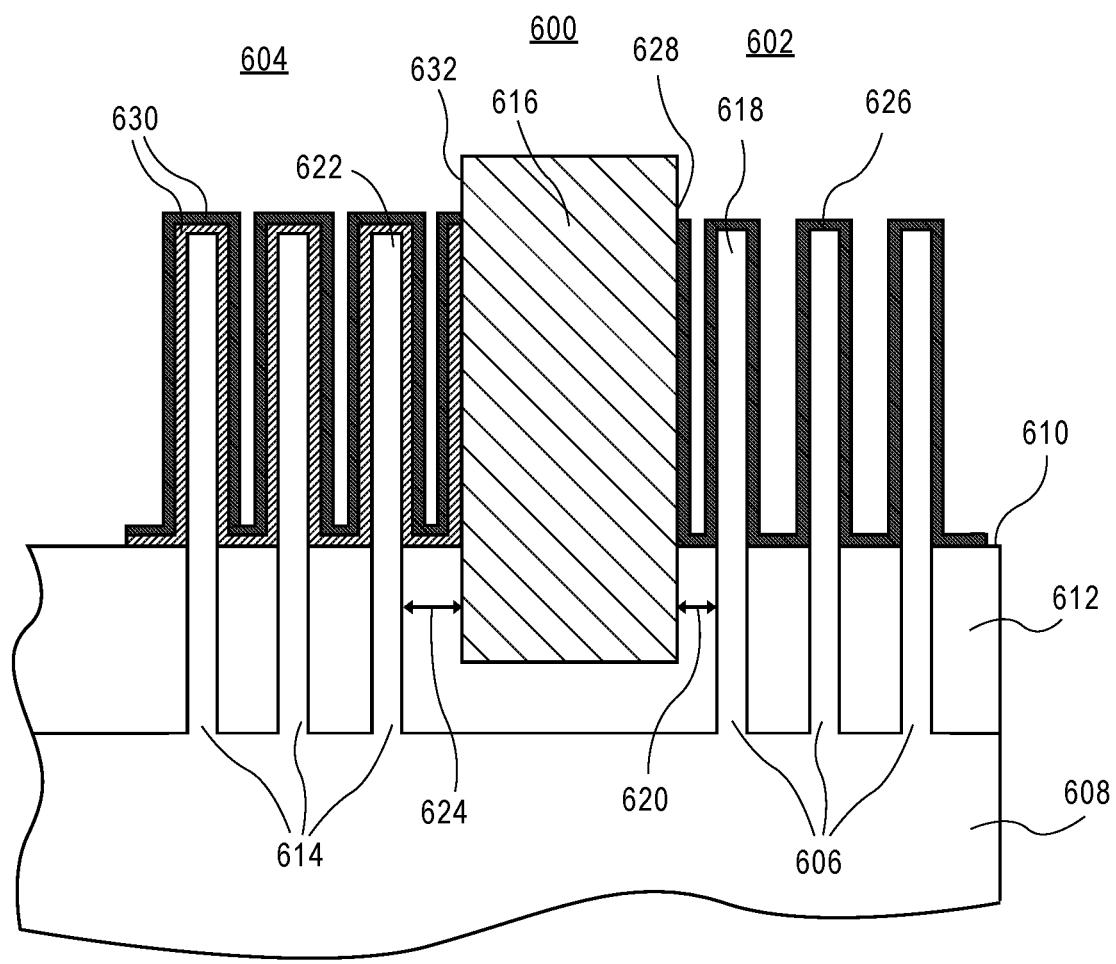
FIG. 6 illustrates a cross-section view of a semiconductor structure having a logic region and a high-voltage (I/O) region separated by a gate edge isolation structure by a differentiated spacing, in accordance with an embodiment of the present invention.

In contrast to FIG. 4 and FIG. 5, FIG. 6 illustrates a cross-section view of a semiconductor structure having a logic region and a high-voltage (I/O) region separated by a gate edge isolation structure by a differentiated spacing, in accordance with an embodiment of the present invention.

Referring to FIG. 6, a semiconductor structure 600 includes a logic device or region 602 and an I/O device or region 604. The logic device or region 602 includes a first plurality of semiconductor fins 606 disposed above a substrate 608 and protruding through an uppermost surface 610 of a trench isolation layer 612. The I/O device or region 604 includes a second plurality of semiconductor fins 614 disposed above the substrate 608 and protruding through the uppermost surface 610 of the trench isolation layer 612. A gate edge isolation structure 616 is disposed between the logic device or region 602 and the I/O device or region 604. A semiconductor fin 618 of the first plurality of semiconductor fins 606 closest to the gate edge isolation structure 616 is spaced from the gate edge isolation structure 616 by a distance 620. A semiconductor fin 622 of the second plurality of semiconductor fins 614 closest to the gate edge isolation structure 616 is spaced from the gate edge isolation structure 616 by a distance 624. In an embodiment, the distance 620 is less than the distance 624. In one embodiment, the distance 620 is less than the distance 624 to provide the semiconductor fin 622 of the second plurality of semiconductor fins 614 closest to the gate edge isolation structure 616 as spaced farther from the gate edge isolation structure 616 than the semiconductor fin 618 of the first plurality of semiconductor fins 606 closest to the gate edge isolation structure 616.

Referring again to FIG. 6, the logic device or region 602 includes a gate dielectric 626 conformal with the first plurality of semiconductor fins 606 and laterally adjacent to and in contact with a first side 628 of the gate edge isolation structure 616. The I/O device or region 604 includes a gate dielectric 630 conformal with the second plurality of semiconductor fins 614 and laterally adjacent to and in contact with a second side 632 of the gate edge isolation structure 616. The gate dielectric 630 is thicker than the gate dielectric 626 and, in some cases, may include more layers than the gate dielectric 626. In an embodiment, since the distance 624 is relatively large, accommodation of the relatively thicker gate dielectric 630 is achieved without pinch-off. Accordingly, subsequent gate electrode fabrication is achieved without defect since gate material can form along the sidewall of fin 622 proximate the gate edge isolation structure 616. On the other hand, since the distance 620 is relatively small, aggressive dimension scaling is achieved.

With reference again to FIG. 6, in an embodiment, the gate endcap of the logic transistors is aggressively scaled due to improved density. Logic devices typically have thin gate dielectrics and, therefore, the narrower endcap reduces adjacent transistor spacing. An SoC process may be implemented requiring a dual oxide or thick gate dielectric flow, where a thicker oxide is deposited on the high voltage devices. The logic device endcap may not have sufficient space to accommodate both the high voltage HV oxide and logic oxide, leading to process-induced functionality defects. Thus, one or more embodiments described herein involve a dual endcap process for ultra-high scale architecture using self-aligned endcap, where an HV transistor has a wider endcap than the endcap of the logic transistor. In one such embodiment, the wider endcap space allows for HV transistor fabrication involving a thick gate dielectric fill process, and can be integrated with a self-aligned endcap architecture for ultra-scaled finfet transistor processing.

In an embodiment, the gate edge isolation structure 616 is disposed in a recess below the uppermost surface 610 of the trench isolation layer 612, as is depicted in FIG. 6. In an embodiment, the gate edge isolation structure includes a lower dielectric portion and a dielectric cap on the lower dielectric portion, examples of which are described below in association with FIG. 9C. In an embodiment, the gate edge isolation structure 616 includes a vertical seam centered within the gate edge isolation structure, examples of which are described below in association with FIG. 9C.

One or more embodiments described herein are directed to, or may be referred to as, a dual endcap process flow for ultra-scaled logic endcap. To provide context, in a typical SAGE flow, a single endcap spacer is deposited to form a self-aligned endcap separating a fin from a SAGE wall. Embodiments described herein may involve formation of differential sacrificial spacer thickness between logic and HV gates. Subsequently, a self-aligned endcap wall is formed. The differential spacer widths are chosen to be thicker in the high voltage areas, and the standard thickness is used in the logic areas. The differential spacer widths may enable high-voltage oxide to be successfully deposited, without sacrificing density in the logic areas. In an embodiment, the thickness of the differential spacer is dependent on the intended HV oxide thickness. For example, in a specific embodiment, a 1.8V technology requires a wider endcap of 5-10 nm, whereas a 3.3V native oxide technology requires a 10-20 nm wider endcap.

The SAGE architecture of FIG. 6 involves lateral separation of fins of a logic region with fins of an I/O region, with differential spacing between each of the regions and a SAGE wall. In another aspect, a SAGE wall may have varying widths, e.g., a thinner width between two I/O regions and a thicker width between two logic regions. As an example, FIGS. 7A-7D illustrate top-angled cross-sectional views representing various operations in a process for fabrication dual self-aligned endcaps, in accordance with an embodiment of the present invention.

Figure 7B:
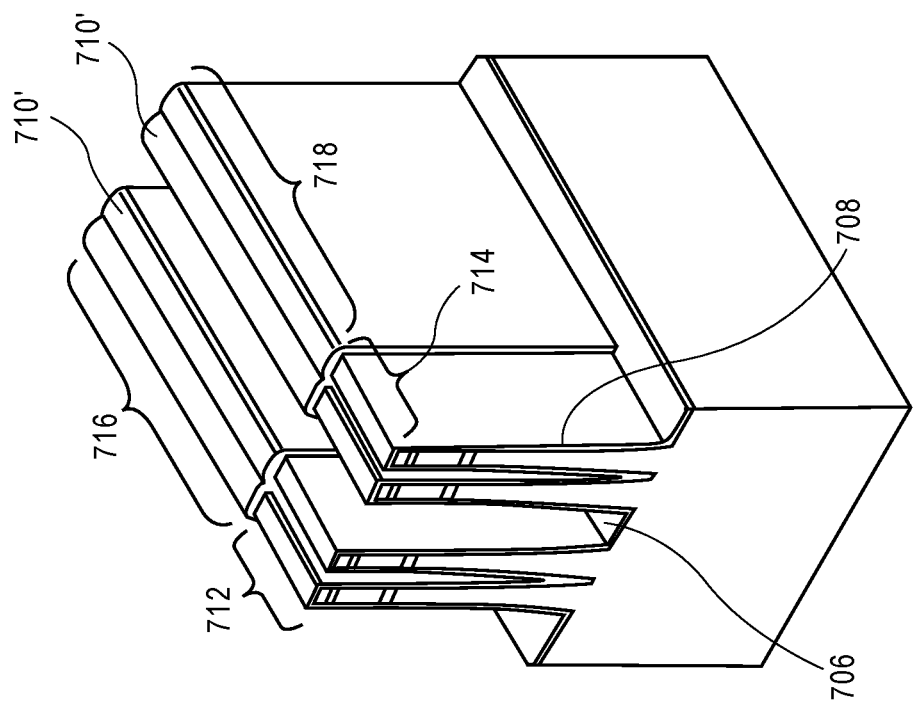
FIGS. 7A-7D illustrate top-angled cross-sectional views representing various operations in a process for fabrication dual self-aligned endcaps, in accordance with an embodiment of the present invention.
Figure 7A:
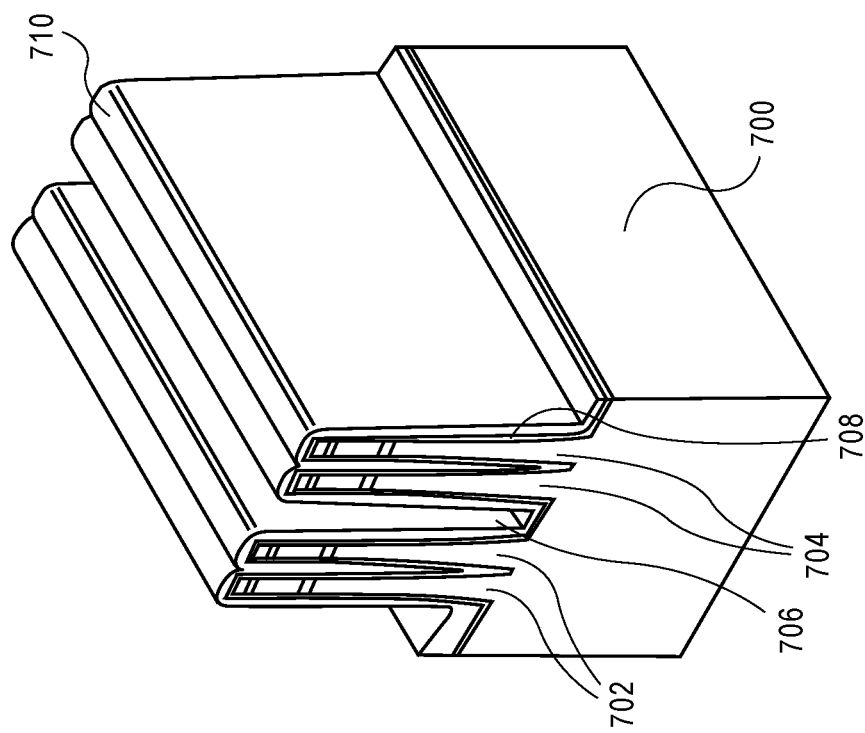

Referring to FIG. 7A, a first plurality of fins 702 and a second plurality of fins 704 is formed above a substrate 700 with a gap 706 between the first plurality of fins 702 and the second plurality of fins 704. A protective liner 708, such as a silicon nitride liner, is formed conformal with the first plurality of fins 702 and the second plurality of fins 704. A spacer material 710, such as a silicon oxide spacer material, is then formed on the protective liner 708 and conformal with the first plurality of fins 702 and the second plurality of fins 704. In one embodiment, the spacer material 710 has a thickness determined by a thickness of a high voltage gate dielectric that is ultimately formed. For example, a 1.8V native oxide may be accommodated by an oxide spacer having a thickness approximately in the range of 5-10 nm.

Referring to FIG. 7B, a patterning process, such as a lithographic masking and etching process is used to expose and remove portions of the spacer material 710 from a first logic region 712 and a second logic region 714. The patterning leaves portions 710' of the spacer material 710 in a first I/O region 716 and a second I/O region 718.

Figure 7D:
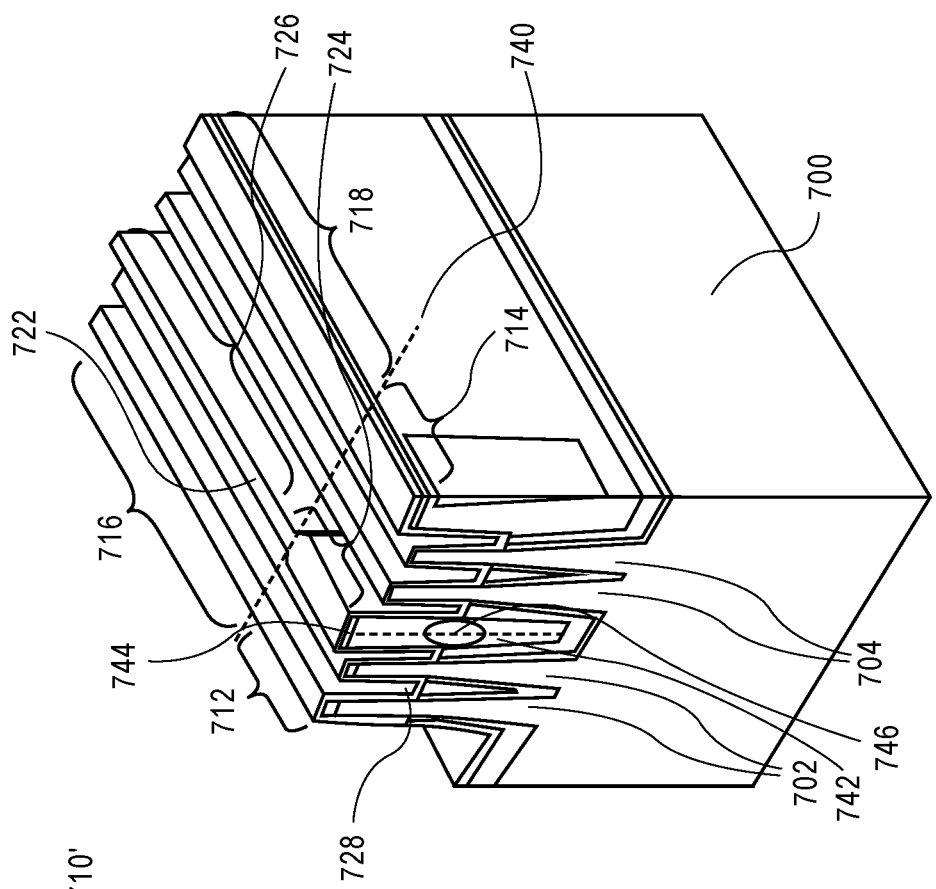
Figure 7C:
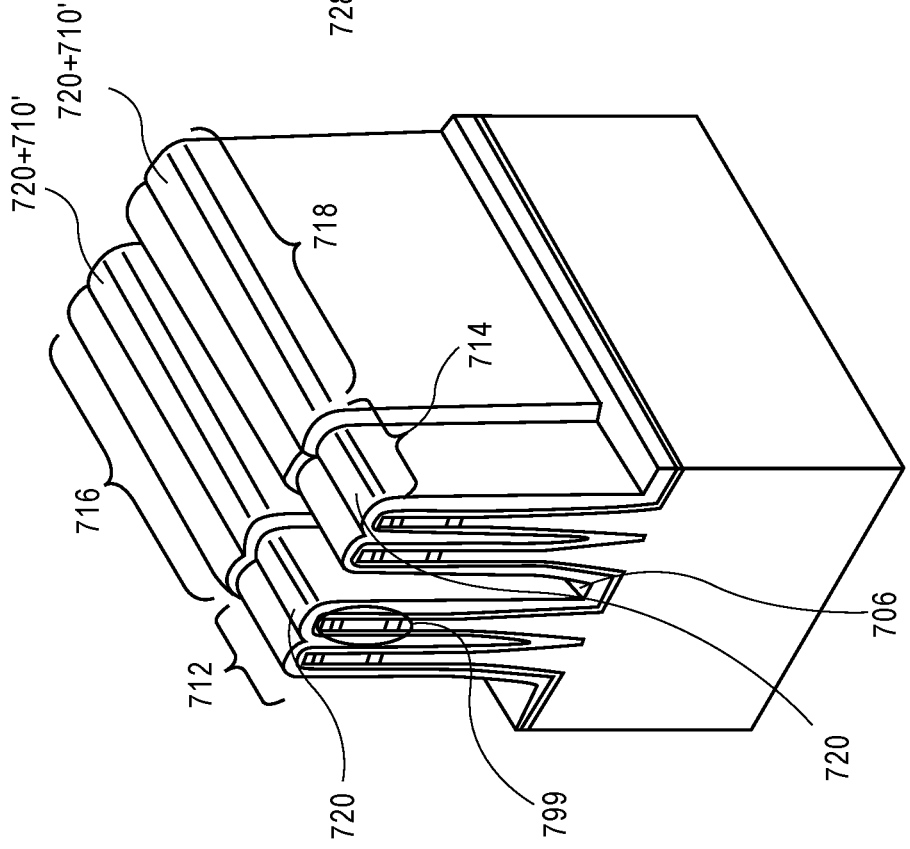

Referring to FIG. 7C, a second spacer material layer 720, such as a silicon oxide spacer material is formed conformal with the structure of FIG. 7B. In an embodiment, the thickness of the second spacer material layer 720 is targeted to the spacing required in the logic transistors. The I/O regions 716 and 718 include both spacer material 710' and 720, while the logic regions 712 and 714 include only the second spacer material 720.

Referring to FIG. 7D, a SAGE wall 722 is then formed. In an embodiment, the SAGE wall 722 is formed by filling a dielectric material in the gap 706. In one such embodiment, a blanket dielectric material deposition and subsequent planarization process is used to form the SAGE wall 722. Subsequently, the second spacer material layer 720 is recessed to form a trench isolation region 728, e.g., by an anisotropic etch process. Sacrificial regions of the fins 702 and 704, e.g., regions 799 depicted in FIG. 7C may also be removed, e.g., by selective etching, to provide the uppermost surface of the fins 702 and 704 below an uppermost surface of the SAGE wall 722, as is depicted in FIG. 7D.

In an embodiment, the SAGE wall has a relatively wide portion 724 and a relatively narrow portion 726. The relatively wide portion 724 separates the I/O regions 716 and 718, and the relatively narrow portion 726 separates the logic regions 712 and 714. In one embodiment, the relatively wide portion 724 is continuous with the relatively narrow portion 726. In an embodiment, the fins 702 and 704 are etched to have their continuity broken separate I/O and logic regions, e.g., along the dashed line 740. The SAGE wall having the relatively wide portion 724 and the relatively narrow portion 726 may be referred to as a dual self-aligned endcap, where the distance between the end fin and the wall is differently spaced in the logic and HV regions according to the thickness of the spacers deposited. Thus, in an embodiment, for a same fin pitch, a SAGE wall is wider in logic regions and narrower in I/O regions, where use of a thicker spacer in the I/O leads to the smaller wall portion.

Referring again to FIG. 7D, in an embodiment, a semiconductor structure includes a first I/O region 716 having a first plurality of semiconductor fins (I/O portion of fins 702) disposed above a substrate 700 and protruding through an uppermost surface of a trench isolation layer 728. A second I/O region 718 has a second plurality of semiconductor fins (I/O portion of fins 704) disposed above the substrate 700 and protruding through an uppermost surface of the trench isolation layer 728. A first logic region 712 has a third plurality of semiconductor fins (logic portion of fins 702) disposed above the substrate 700 and protruding through the uppermost surface of the trench isolation layer 728. A second logic region 714 has a fourth plurality of semiconductor fins (logic portion of fins 704) disposed above the substrate 700 and protruding through the uppermost surface of the trench isolation layer 728. A gate edge isolation structure 722 has a first portion 726 separating the first I/O region 716 from the second I/O region 718. The gate edge isolation structure 722 also has a second portion 724 separating the first logic region 712 from the second logic region 714. In an embodiment, the first portion 726 is continuous with the second portion 724. The first portion 726 has a width between the first I/O region 716 from the second I/O region 718 smaller than a width of the second portion 724 between the first logic region 712 from the second logic region 714.

In an embodiment, the gate edge isolation structure 722 is disposed in a recess below the uppermost surface of the trench isolation layer 728, as is depicted in FIG. 7D. In an embodiment, the gate edge isolation structure 722 includes a lower dielectric portion 742 and a dielectric cap 744 on the lower dielectric portion 742, as is depicted in FIG. 7D and as is described in greater detail in association with FIG. 9C. In an embodiment, the gate edge isolation structure 722 includes a vertical seam 746 centered within the gate edge isolation structure 722, as is depicted in FIG. 7D and as is described in greater detail in association with FIG. 9C.

Figure 8A:
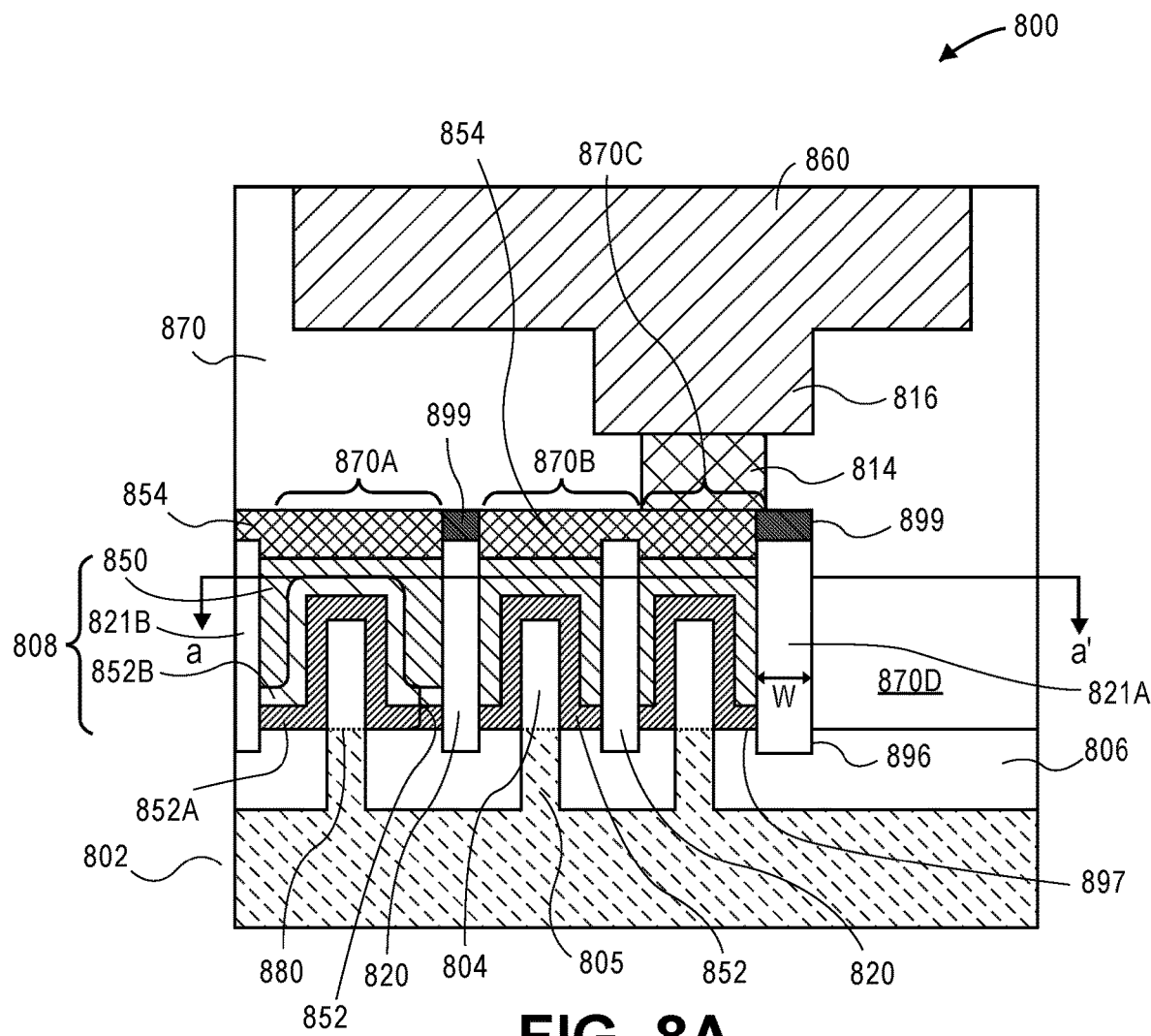
FIG. 8A illustrates a cross-sectional view of non-planar semiconductor devices having self-aligned gate edge isolation, in accordance with an embodiment of the present invention.
Figure 8B:
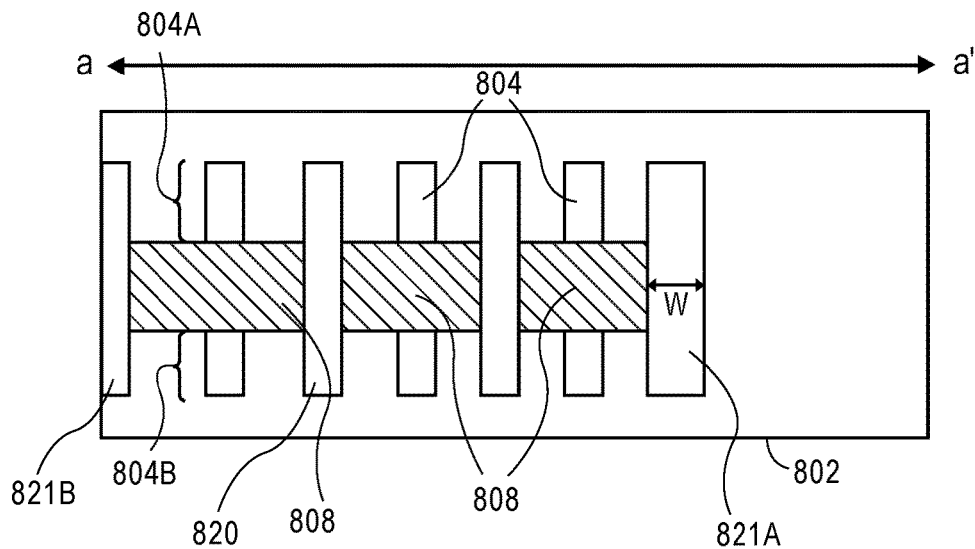
FIG. 8B illustrates a plan view taken along the a-a' axis of the semiconductor devices of FIG. 8A, in accordance with an embodiment of the present invention.

It is to be appreciated that the structures resulting from the above exemplary processing schemes may be used in a same or similar form for subsequent processing operations to complete device fabrication, such as PMOS and NMOS device fabrication. As an example of completed devices, FIG. 8A illustrates a cross-sectional view of non-planar semiconductor devices having self-aligned gate edge isolation (SAGE) structures, in accordance with an embodiment of the present invention. FIG. 8B illustrates a plan view taken along the a-a' axis of the structure of FIG. 8A, in accordance with an embodiment of the present invention.

Referring to FIG. 8A, a semiconductor structure 800 includes non-planar active regions (e.g., fin structures each including a protruding fin portion 804 and a sub-fin region 805) formed from substrate 802, and within a trench isolation layer 806. In an embodiment, the fin structures are a plurality of fin lines that form a grating structure such as a tight pitch grating structure. In one such embodiment, the tight pitch is not achievable directly through conventional lithography. For example, a pattern based on conventional lithography may first be formed, but the pitch may be halved by the use of spacer mask patterning, as is known in the art. Even further, the original pitch may be quartered by a second round of spacer mask patterning. Accordingly, grating-like fin patterns may have lines spaced at a constant pitch and having a constant width. The pattern may be fabricated by a pitch halving or pitch quartering, or other pitch division, approach. Each of the individual fins 804 depicted may represent corresponding individual fins, or may represent a plurality of fins at a given location.

Gate structures 808 are disposed over the protruding portions 804 of the non-planar active regions as well as over a portion of the trench isolation layer 806. As shown, gate structures 808 include a gate electrode 850 and a gate dielectric layer 852. In one embodiment, although not shown, gate structures 808 may also include a dielectric cap layer.

Gate structures 808 are separated by narrow self-aligned gate edge (SAGE) isolation structures or walls 820, 821A or 821B. The SAGE walls 820 each have a width. In an embodiment, the SAGE wall 821A has a width greater than the width of each of the SAGE walls 820, and the SAGE wall 821B has a width less than the width of each of the SAGE walls 820. SAGE walls of differing width may be associated with different device types, as described in an exemplary embodiment below. Each SAGE wall 820, 821A or 821B may include one or more of a local interconnect 854 or a dielectric plug 899 formed thereon. In an embodiment, each of the SAGE walls 820, 821A or 821B is recessed below an uppermost surface 897 of the trench isolation layer 806, as is depicted in FIG. 8A.

In an exemplary embodiment, the semiconductor structure 800 includes a first plurality of semiconductor fins (fin or fins 804 of region 870A) disposed above a substrate 802 and protruding through an uppermost surface 897 of a trench isolation layer 806, and a first gate structure (gate structure

808 of region 870A) disposed over the first plurality of semiconductor fins. A second plurality of semiconductor fins (fin or fins 804 of region 870B) is disposed above the substrate 802 and protrudes through the uppermost surface 897 of the trench isolation layer 806, and a second gate structure (gate structure 808 of region 870B) is disposed over the second plurality of semiconductor fins. A gate edge isolation structure (left-hand SAGE wall 820) is disposed between and in contact with the first gate structure and the second gate structure. A semiconductor fin of the first plurality of semiconductor fins closest to the gate edge isolation structure (from region 870A) is spaced farther from the gate edge isolation structure than a semiconductor fin of the second plurality of semiconductor fins closest to the gate edge isolation structure (from region 870B).

In an embodiment, region 870A is an I/O region, and region 870B is a logic region. As depicted, in one such embodiment, a second logic region 870C is adjacent the logic region 870B, and is electrically connected to the logic region 870B by a local interconnect 854. Another region 870D may be a location where an addition logic or I/O region may be placed. Embodiments described herein may involve differential spacing from a SAGE wall (e.g., a wider spacing from SAGE walls 821B and left-hand 820 in region 870A), or may involve SAGE walls of differing width (e.g., narrower 821B versus 820 versus wider 821A), or both differential spacing from a SAGE wall and SAGE walls of differing width. In an embodiment, I/O regions have a greater spacing between SAGE walls than a logic region. In an embodiment, a wider SAGE wall is between adjacent logic regions than is between adjacent I/O regions.

A gate contact 814, and overlying gate contact via 816 are also seen from this perspective, along with an overlying metal interconnect 860, all of which are disposed in interlayer dielectric stacks or layers 870. Also seen from the perspective of FIG. 8A, the gate contact 814 is, in one embodiment, disposed over the non-planar active regions. As is also depicted in FIG. 8A, an interface 880 exists between a doping profile of protruding fin portions 804 and sub-fin regions 805, although other embodiments do not include such an interface in doping profile between these regions.

Referring to FIG. 8B, the gate structures 808 are shown as disposed over the protruding fin portions 804, as isolated by self-aligned gate edge isolation structures 820. In an embodiment, the gate structures 808 form one line of a plurality of parallel gate lines that form a grating structure such as a tight pitch grating structure. In one such embodiment, the tight pitch is not achievable directly through conventional lithography. For example, a pattern based on conventional lithography may first be formed, but the pitch may be halved by the use of spacer mask patterning, as is known in the art. Even further, the original pitch may be quartered by a second round of spacer mask patterning. Accordingly, grating-like gate patterns may have lines spaced at a constant pitch and having a constant width. The pattern may be fabricated by a pitch halving or pitch quartering, or other pitch division, approach.

Referring again to FIG. 8B, source and drain regions 804A and 804B of the protruding fin portions 804 are shown in this perspective, although it is to be appreciated that these regions would be overlapped with trench contact structures. In one embodiment, the source and drain regions 804A and 804B are doped portions of original material of the protruding fin portions 804. In another embodiment, the material of the protruding fin portions 804 is removed and replaced with another semiconductor material, e.g., by epitaxial deposition. In either case, the source and drain regions 804A and 804B may extend below the height of trench isolation layer 806, i.e., into the sub-fin region 805.

In an embodiment, the semiconductor structure 800 includes non-planar devices such as, but not limited to, a finFET or a tri-gate device. In such an embodiment, a corresponding semiconducting channel region is composed of or is formed in a three-dimensional body. In one such embodiment, the gate structures 808 surround at least a top surface and a pair of sidewalls of the three-dimensional body.

Substrate 802 may be composed of a semiconductor material that can withstand a manufacturing process and in which charge can migrate. In an embodiment, substrate 802 is a bulk substrate composed of a crystalline silicon, silicon/germanium or germanium layer doped with a charge carrier, such as but not limited to phosphorus, arsenic, boron or a combination thereof, to form active region 804. In one embodiment, the concentration of silicon atoms in bulk substrate 802 is greater than 97%. In another embodiment, bulk substrate 802 is composed of an epitaxial layer grown atop a distinct crystalline substrate, e.g. a silicon epitaxial layer grown atop a boron-doped bulk silicon mono-crystalline substrate. Bulk substrate 802 may alternatively be composed of a group III-V material. In an embodiment, bulk substrate 802 is composed of a III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In one embodiment, bulk substrate 802 is composed of a III-V material and the charge-carrier dopant impurity atoms are ones such as, but not limited to, carbon, silicon, germanium, oxygen, sulfur, selenium or tellurium.

Trench isolation layer 806 may be composed of a material suitable to ultimately electrically isolate, or contribute to the isolation of, portions of a permanent gate structure from an underlying bulk substrate or isolate active regions formed within an underlying bulk substrate, such as isolating fin active regions. For example, in one embodiment, the trench isolation layer 806 is composed of a dielectric material such as, but not limited to, silicon dioxide, silicon oxy-nitride, silicon nitride, or carbon-doped silicon nitride.

Self-aligned gate edge isolation structures 820, 821A and 821B may be composed of a material or materials suitable to ultimately electrically isolate, or contribute to the isolation of, portions of permanent gate structures from one another. Exemplary materials or material combinations include a single material structure such as silicon dioxide, silicon oxy-nitride, silicon nitride, or carbon-doped silicon nitride. Other exemplary materials or material combinations include a multi-layer stack having lower portion silicon dioxide, silicon oxy-nitride, silicon nitride, or carbon-doped silicon nitride and an upper portion higher dielectric constant material such as hafnium oxide. Additional examples are described below in association with FIGS. 9A-9C.

Gate structures 808 may be composed of a gate electrode stack which includes a gate dielectric layer 852 and a gate electrode layer 850. In an embodiment, the gate electrode of the gate electrode stack is composed of a metal gate and the gate dielectric layer includes a high-K material.

In an exemplary embodiment, the gate structure 808 of region 870A includes a first gate dielectric 852 conformal with the first plurality of semiconductor fins and laterally adjacent to and in contact with a first side of the gate edge isolation structure (left-hand 820). The second gate stack of region 870B includes a second gate dielectric 852 conformal with the second plurality of semiconductor fins and laterally adjacent to and in contact with a second side of the gate edge isolation structure opposite the first side of the gate edge isolation structure. In one embodiment, the first gate dielectric is thicker than the second gate dielectric, as is depicted in FIG. 8A. In one embodiment, the first gate dielectric has more dielectric layers (e.g., layers 852A and 852B) than the second gate dielectric (e.g., only layer 852). In an embodiment, the gate dielectric of region 870A is an I/O gate dielectric, and the gate dielectric of region 870B is a logic gate dielectric.

In an embodiment, the gate dielectric of region 870B is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of the substrate 802. In an embodiment, the gate dielectric layer is composed of a top high-k portion and a lower portion composed of an oxide of a semiconductor material. In one embodiment, the gate dielectric layer is composed of a top portion of hafnium oxide and a bottom portion of silicon dioxide or silicon oxy-nitride. In an embodiment, the top high-k portion consists of a "U"-shaped structure that includes a bottom portion substantially parallel to the surface of the substrate and two sidewall portions that are substantially perpendicular to the top surface of the substrate. In an embodiment, the gate dielectric of region 870A includes a layer of non-native silicon oxide in addition to a layer of high-k material. The layer of non-native silicon oxide may be formed using a CVD process and may be formed below or above the layer of high-k material. In an exemplary embodiment, the layer of non-native silicon oxide (e.g., layer 852A) is formed below a layer of high-k material (e.g., layer 852B).

In one embodiment, the gate electrode is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction-setting fill material formed above a metal workfunction-setting layer. In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

Spacers associated with the gate electrode stacks may be composed of a material suitable to ultimately electrically isolate, or contribute to the isolation of, a permanent gate structure from adjacent conductive contacts, such as self-aligned contacts. For example, in one embodiment, the spacers are composed of a dielectric material such as, but not limited to, silicon dioxide, silicon oxy-nitride, silicon nitride, or carbon-doped silicon nitride.

Local interconnect 854, gate contact 814, overlying gate contact via 816, and overlying metal interconnect 860 may be composed of a conductive material. In an embodiment, one or more of the contacts or vias are composed of a metal species. The metal species may be a pure metal, such as tungsten, nickel, or cobalt, or may be an alloy such as a metal-metal alloy or a metal-semiconductor alloy (e.g., such as a silicide material). A common example is the use of copper structures that may or may not include barrier layers (such as Ta or TaN layers) between the copper and surrounding ILD material. As used herein, the term metal includes alloys, stacks, and other combinations of multiple metals. For example, the metal interconnect lines may include barrier layers, stacks of different metals or alloys, etc.

In an embodiment (although not shown), providing structure 800 involves formation of a contact pattern which is essentially perfectly aligned to an existing gate pattern while eliminating the use of a lithographic step with exceedingly tight registration budget. In one such embodiment, this approach enables the use of intrinsically highly selective wet etching (e.g., versus conventionally implemented dry or plasma etching) to generate contact openings. In an embodiment, a contact pattern is formed by utilizing an existing gate pattern in combination with a contact plug lithography operation. In one such embodiment, the approach enables elimination of the need for an otherwise critical lithography operation to generate a contact pattern, as used in conventional approaches. In an embodiment, a trench contact grid is not separately patterned, but is rather formed between poly (gate) lines. For example, in one such embodiment, a trench contact grid is formed subsequent to gate grating patterning but prior to gate grating cuts.

Furthermore, the gate structures 808 may be fabricated by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including use of $SF_6$. In another embodiment, dummy gates are composed of polycrystalline silicon or amorphous silicon and are removed with a wet etch process including use of aqueous $NH_4OH$ or tetramethylammonium hydroxide. In one embodiment, dummy gates are composed of silicon nitride and are removed with a wet etch including aqueous phosphoric acid.

In an embodiment, one or more approaches described herein contemplate essentially a dummy and replacement gate process in combination with a dummy and replacement contact process to arrive at structure 800. In one such embodiment, the replacement contact process is performed after the replacement gate process to allow high temperature anneal of at least a portion of the permanent gate stack. For example, in a specific such embodiment, an anneal of at least a portion of the permanent gate structures, e.g., after a gate dielectric layer is formed, is performed at a temperature greater than approximately 600 degrees Celsius. The anneal is performed prior to formation of the permanent contacts.

Referring again to FIG. 8A, in an embodiment, a semiconductor device has contact structures that contact portions of a gate electrode formed over an active region. In general, prior to (e.g., in addition to) forming a gate contact structure (such as a via) over an active portion of a gate and in a same layer as a trench contact via, one or more embodiments of the present invention include first using a gate aligned trench contact process. Such a process may be implemented to form trench contact structures for semiconductor structure fabrication, e.g., for integrated circuit fabrication. In an embodiment, a trench contact pattern is formed as aligned to an existing gate pattern. By contrast, conventional approaches typically involve an additional lithography process with tight registration of a lithographic contact pattern to an existing gate pattern in combination with selective contact etches. For example, a conventional process may include patterning of a poly (gate) grid with separate patterning of contact features.

It is to be appreciated that, as exemplified in FIGS. 8A and 8B, SAGE walls of varying width may be fabricated. It is also to be appreciated that fabrication of gate edge isolation structures may lead to formation of a seam within the gate edge isolation structures. It is also to be appreciated that a stack of dielectric layers may be used to form a SAGE wall. It is also to be appreciated that gate edge isolation structures may differ in composition depending on the spacing of adjacent fins. As an example covering all such aspects, FIGS. 9A-9C illustrate cross-sectional views of process operations of significance in another self-aligned gate edge process fabrication scheme for finFET or tri-gate devices, in accordance with an embodiment of the present invention.

Figure 9A:
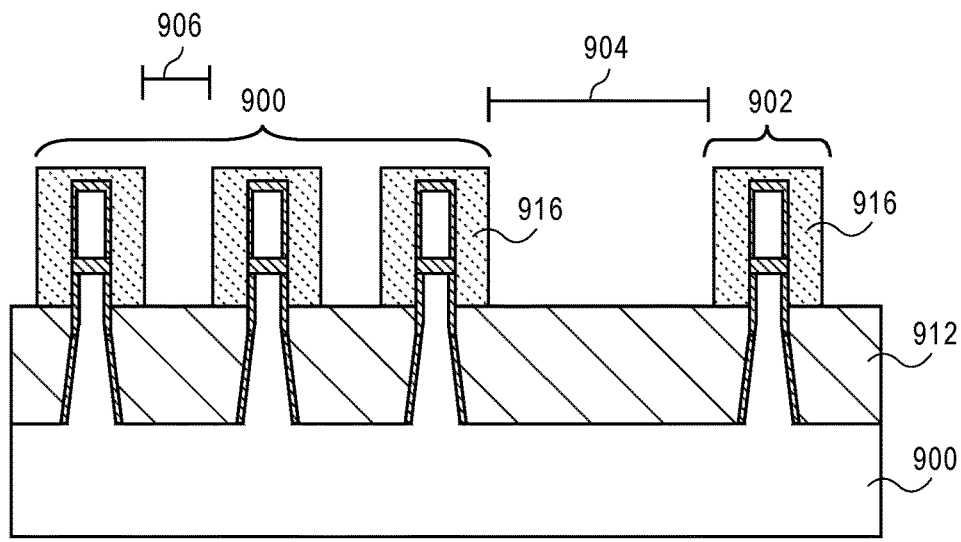
FIGS. 9A-9C illustrate cross-sectional views of process operations of significance in another self-aligned gate edge process fabrication scheme for finFET or tri-gate devices, in accordance with an embodiment of the present invention.

Referring to FIG. 9A, a grouping of fins 900 has a spacing 906. The grouping of fins 900 is adjacent to a fin 902 by a larger spacing 904. Sacrificial spacers 916 are formed adjacent to sidewalls of the upper portions of each of plurality of semiconductor fins 900 and 902.

Figure 9B:
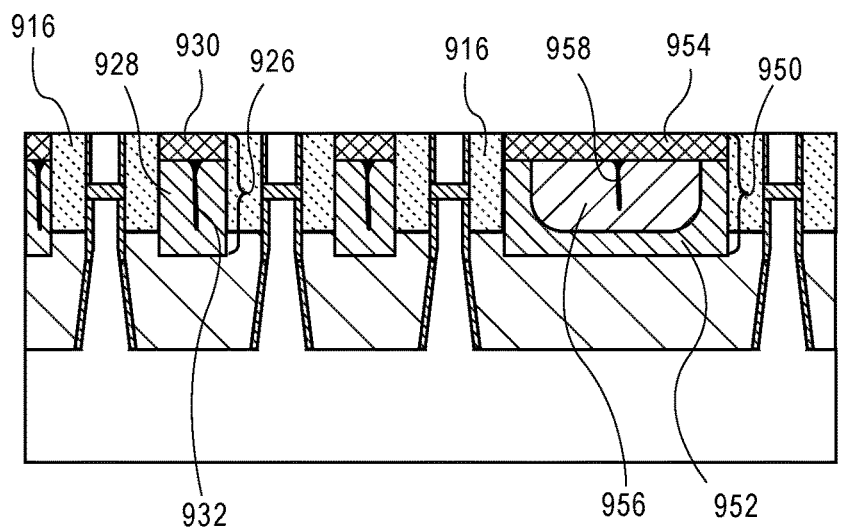
Figure 9C:
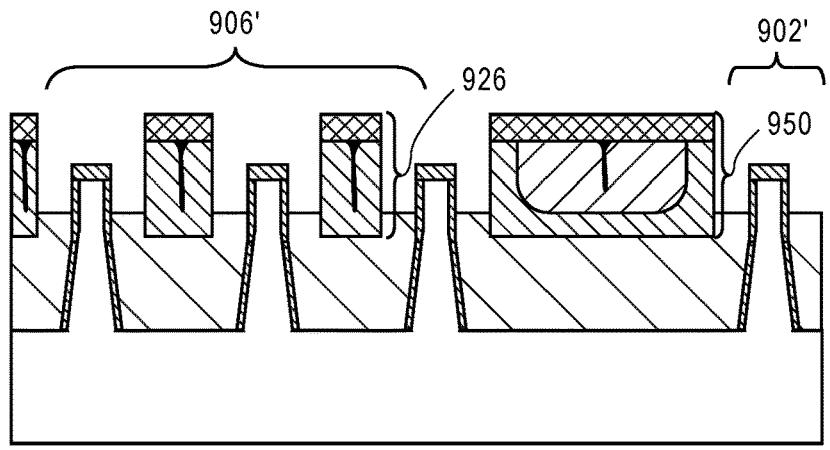

Referring to FIG. 9B, a plurality of gate edge isolation structures 926 and 950 is formed between the sacrificial spacers 916. In an embodiment, as depicted, each of the plurality of gate edge isolation structures 926 formed between spacings 906 includes a lower dielectric portion 928 and a dielectric cap 930 on the lower dielectric portion 928. In an embodiment, the plurality of gate edge isolation structures 926 is formed by depositing and then recessing a first dielectric material, such as a silicon nitride layer, to provide the lower dielectric portions 928. The deposition process may be a conformal process which, in one embodiment, provides seams 932 within the lower dielectric portion 928. Thus, in an embodiment, each of the plurality of gate edge isolation structures 926 includes a vertical seam 932 centered within the gate edge isolation structure 926. A dielectric cap material, such as a metal oxide material (e.g., hafnium oxide) is then formed in recessed regions above the lower dielectric portions 928. The dielectric cap material may be planarized to form the dielectric cap 930 or may be grown upward to provide the dielectric cap 930 directly.

Referring again to FIG. 9B, in an embodiment, a gate edge isolation structure 926 is between semiconductor fins having a spacing 906 and a gate edge isolation structure 950 is between semiconductor fins having a spacing 904. The gate edge isolation structure 926 has a width narrower than a corresponding width of gate edge isolation structure 950. In one embodiment, the gate edge isolation structure 926 has a total composition different than a total composition of the gate edge isolation structure 950. In one such embodiment, gate edge isolation structure 950 further includes a third dielectric layer 956, such as a layer of silicon oxide on a bottom portion of and within sidewalls of a lower dielectric portion 952. A dielectric cap 952 is further on the third dielectric layer 956. In an embodiment, the sidewalls of the lower dielectric portion 952 have an uppermost surface approximately co-planar with an uppermost surface of the third dielectric layer 956, and the dielectric cap 952 has a substantially planar bottommost surface, as is depicted in FIG. 9B. In another embodiment, the sidewalls of the lower dielectric portion 952 have an uppermost surface below an uppermost surface of the third dielectric layer 956, and the dielectric cap 952 extends further down over the sidewall locations. In yet another embodiment, the sidewalls of the lower dielectric portion 952 have an uppermost surface above an uppermost surface of the third dielectric layer 956, and the dielectric cap 952 extends further down over the third dielectric layer 956.

In an embodiment, the deposition process of layer 956 is a conformal process which, in one embodiment, provides vertical seams 958 within the third dielectric layer 956. However, in another embodiment, a seam 958 is not formed in wider structures but is formed in narrower structures (e.g., seam 932 described above). It is to be appreciated that layers 928 and 952 may be composed of a same material, such as silicon nitride, and formed at a same time as one another. It is also to be appreciated that layers 930 and 954 may be composed of a same material, such as hafnium oxide, and formed at a same time as one another. The third dielectric layer 956 in structure 950 but omitted from structure 926 may be formed by conformal deposition across the entire structure but is excluded from structures 926 since the layer 928 essentially fills the spacing 906 in a first deposition process which does not entirely fill the spacing 904.

Referring to FIG. 9C, the sacrificial spacers 916 are removed. In an embodiment, the sacrificial spacers 916 are removed by a wet etch or dry etch process. In an embodiment, patterning stack layers above the fins are also removed to provide fins 906' and 902'.

Referring again to FIG. 9C, in an embodiment, a gate edge isolation structure 926 or 950 is disposed in corresponding recesses below an uppermost surface of a trench isolation layer. In an embodiment, a gate edge isolation structure 926 or 950 includes a lower dielectric portion and a dielectric cap on the lower dielectric portion. In an embodiment, a gate edge isolation structure 926 or 950 includes a vertical seam centered within the second gate edge isolation structure. In an embodiment, a first gate edge isolation structure 926 has a total composition different than a total composition of the second gate edge isolation structure 950, e.g., by the inclusion of an additional fill dielectric material.

In an embodiment where a gate edge isolation structure 926 or 950 includes a lower dielectric portion and a dielectric cap on the lower dielectric portion, the gate edge isolation structure 926 or 950 may be formed by first depositing and then recessing a first dielectric material, such as a SiN layer, a SiCN layer, a SiOCN layer, a SiOC layer, or a SiC layer, to provide the lower dielectric portion. In one embodiment, the first dielectric material is a silicon nitride layer. A dielectric cap material, such as a metal oxide material (e.g., hafnium oxide, hafnium aluminum oxide, or aluminum oxide) is then formed in recessed regions above the lower dielectric portion. In one embodiment, the metal oxide material is hafnium oxide. In another embodiment, the dielectric cap material is a low-k dielectric material. The dielectric cap material may be planarized to form the dielectric cap or may be grown upward to provide the dielectric cap directly.

In an embodiment, as used throughout the present description, interlayer dielectric (ILD) material is composed of or includes a layer of a dielectric or insulating material.

Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

In an embodiment, as is also used throughout the present description, metal lines or interconnect line material (and via material) is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers (e.g., layers including one or more of Ta, TaN, Ti or TiN), stacks of different metals or alloys, etc. Thus, the interconnect lines may be a single material layer, or may be formed from several layers, including conductive liner layers and fill layers. Any suitable deposition process, such as electroplating, chemical vapor deposition or physical vapor deposition, may be used to form interconnect lines. In an embodiment, the interconnect lines are composed of a conductive material such as, but not limited to, Cu, Al, Ti, Zr, Hf, V, Ru, Co, Ni, Pd, Pt, W, Ag, Au or alloys thereof. The interconnect lines are also sometimes referred to in the art as traces, wires, lines, metal, or simply interconnect.

In an embodiment, as is also used throughout the present description, hardmask materials, capping layers, or plugs are composed of dielectric materials different from the interlayer dielectric material. In one embodiment, different hardmask, capping or plug materials may be used in different regions so as to provide different growth or etch selectivity to each other and to the underlying dielectric and metal layers. In some embodiments, a hardmask layer, capping or plug layer includes a layer of a nitride of silicon (e.g., silicon nitride) or a layer of an oxide of silicon, or both, or a combination thereof. Other suitable materials may include carbon-based materials. Other hardmask, capping or plug layers known in the arts may be used depending upon the particular implementation. The hardmask, capping or plug layers maybe formed by CVD, PVD, or by other deposition methods.

In an embodiment, as is also used throughout the present description, lithographic operations are performed using 193 nm immersion litho (i193), EUV and/or EBDW lithography, or the like. A positive tone or a negative tone resist may be used. In one embodiment, a lithographic mask is a trilayer mask composed of a topographic masking portion, an anti-reflective coating (ARC) layer, and a photoresist layer. In a particular such embodiment, the topographic masking portion is a carbon hardmask (CHM) layer and the anti-reflective coating layer is a silicon ARC layer.

In an embodiment, approaches described above may be implemented to supports multi-gate SoC process nodes at scaled dimensions. Implementations may be detectable upon reverse engineering of high voltage oxide locations on I/O transistors. As technologies continue to shrink the endcap dimension, the endcap space required for a high-voltage device may need to be larger than logic device. Approaches described herein may enable SoC technologies to continue to scale logic dimensions while retaining high voltage integration.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 10:
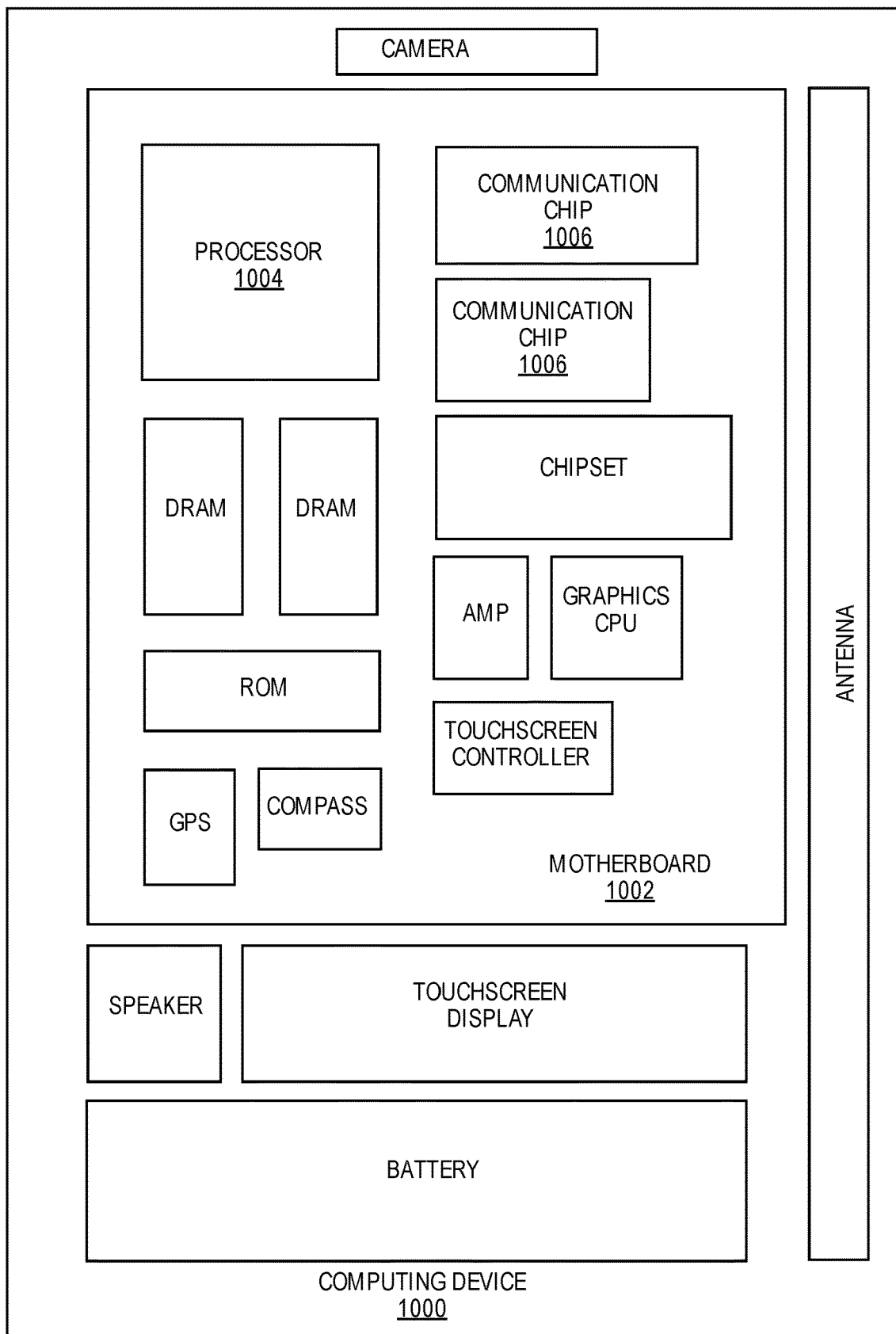
FIG. 10 illustrates a computing device in accordance with one implementation of an embodiment of the invention.

FIG. 10 illustrates a computing device 1000 in accordance with one implementation of an embodiment of the present invention. The computing device 1000 houses a board 1002. The board 1002 may include a number of components, including but not limited to a processor 1004 and at least one communication chip 1006. The processor 1004 is physically and electrically coupled to the board 1002. In some implementations the at least one communication chip 1006 is also physically and electrically coupled to the board 1002. In further implementations, the communication chip 1006 is part of the processor 1004.

Depending on its applications, computing device 1000 may include other components that may or may not be physically and electrically coupled to the board 1002. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1006 enables wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 50, and beyond. The computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing device 1000 includes an integrated circuit die packaged within the processor 1004. The integrated circuit die of the processor 1004 may include one or more structures, such as self-aligned gate edge (SAGE) structures built in accordance with implementations of embodiments of the present invention. The term "processor" may refer to any device or portion of a device that processes electronic data from registers and/or memory to transform that electronic data into other electronic data that may be stored in registers and/or memory.

The communication chip 1006 also includes an integrated circuit die packaged within the communication chip 1006. The integrated circuit die of the communication chip 1006 may include one or more structures, such as self-aligned gate edge (SAGE) structures built in accordance with implementations of embodiments of the present invention.

In further implementations, another component housed within the computing device 1000 may contain an integrated circuit die that includes one or structures, such as self-aligned gate edge (SAGE) structures built in accordance with implementations of embodiments of the present invention.

In various implementations, the computing device 1000 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1000 may be any other electronic device that processes data.

Figure 11:
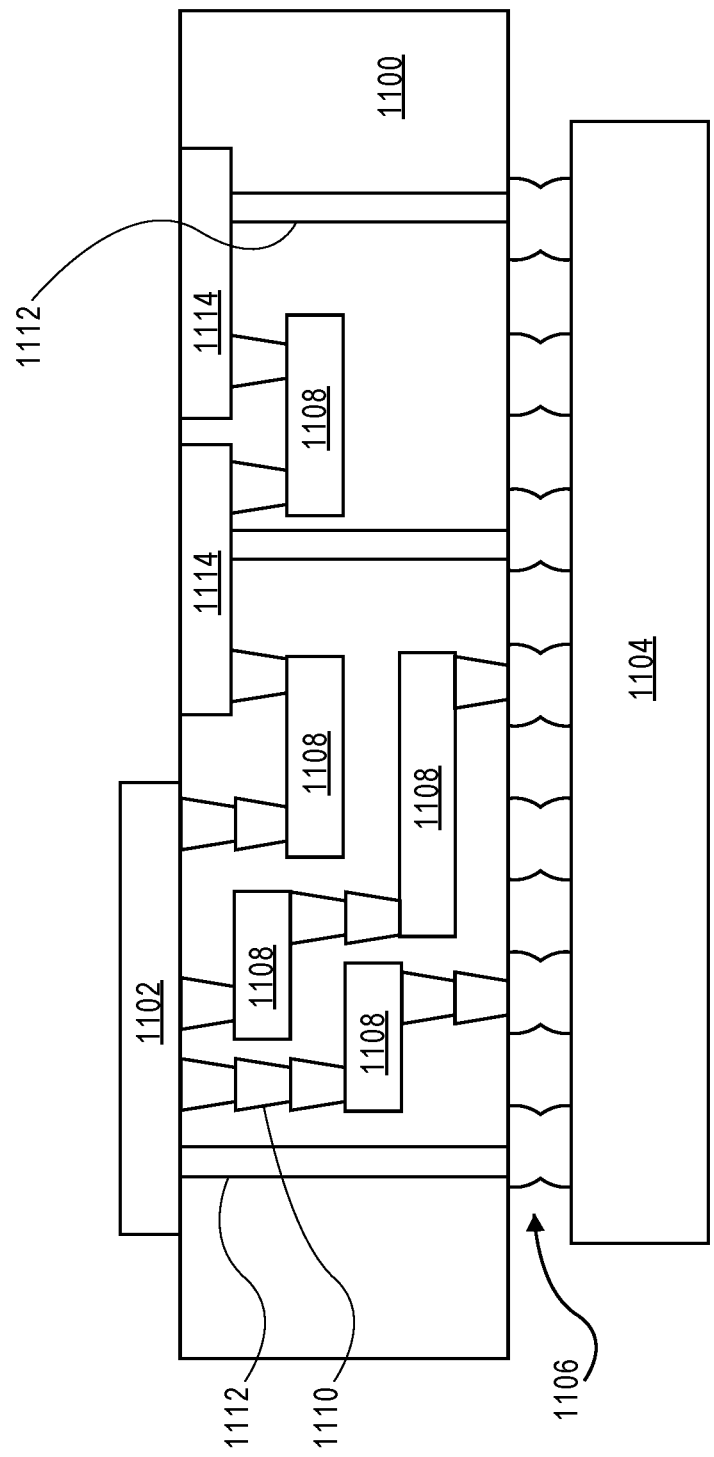
FIG. 11 illustrates an interposer that includes one or more embodiments of the invention.

FIG. 11 illustrates an interposer 1100 that includes one or more embodiments of the present invention. The interposer 1100 is an intervening substrate used to bridge a first substrate 1102 to a second substrate 1104. The first substrate 1102 may be, for instance, an integrated circuit die. The second substrate 1104 may be, for instance, a memory module, a computer motherboard, or another integrated circuit die. Generally, the purpose of an interposer 1100 is to spread a connection to a wider pitch or to reroute a connection to a different connection. For example, an interposer 1100 may couple an integrated circuit die to a ball grid array (BGA) 1106 that can subsequently be coupled to the second substrate 1104. In some embodiments, the first and second substrates 1102/1104 are attached to opposing sides of the interposer 1100. In other embodiments, the first and second substrates 1102/1104 are attached to the same side of the interposer 1100. And in further embodiments, three or more substrates are interconnected by way of the interposer 1100.

The interposer 1100 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 1108 and vias 1110, including but not limited to through-silicon vias (TSVs) 1112. The interposer 1100 may further include embedded devices 1114, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1100. In accordance with embodiments of the invention, apparatuses or processes disclosed herein may be used in the fabrication of interposer 1100 or in the fabrication of components included in the interposer 1100.

Thus, embodiments of the present invention include dual fin endcaps for self-aligned gate edge architectures, and methods of fabricating dual fin endcaps for self-aligned gate edge architectures.

Example Embodiment 1

A semiconductor structure includes a first plurality of semiconductor fins disposed above a substrate and protruding through an uppermost surface of a trench isolation layer. A first gate structure is disposed over the first plurality of semiconductor fins, the first gate structure defining a channel region in each of the first plurality of semiconductor fins and source and drain regions on opposing ends of the channel regions of each of the first plurality of semiconductor fins. A second plurality of semiconductor fins is disposed above the substrate and protrudes through the uppermost surface of the trench isolation layer. A second gate structure is disposed over the second plurality of semiconductor fins, the second gate structure defining a channel region in each of the second plurality of semiconductor fins and source and drain regions on opposing ends of the channel regions of each of the second plurality of semiconductor fins. A gate edge isolation structure is disposed between and in contact with the first gate structure and the second gate structure. A semiconductor fin of the first plurality of semiconductor fins closest to the gate edge isolation structure is spaced farther from the gate edge isolation structure than a semiconductor fin of the second plurality of semiconductor fins closest to the gate edge isolation structure.

Example Embodiment 2

The semiconductor structure of example embodiment 1, wherein the first gate stack includes a first gate dielectric, the first gate dielectric conformal with the first plurality of semiconductor fins and laterally adjacent to and in contact with a first side of the gate edge isolation structure, and wherein the second gate stack includes a second gate dielectric, the second gate dielectric conformal with the second plurality of semiconductor fins and laterally adjacent to and in contact with a second side of the gate edge isolation structure opposite the first side of the gate edge isolation structure.

Example Embodiment 3

The semiconductor structure of example embodiment 2, wherein the first gate dielectric is thicker than the second gate dielectric.

Example Embodiment 4

The semiconductor structure of example embodiment 2 or 3, wherein the first gate dielectric has more dielectric layers than the second gate dielectric.

Example Embodiment 5

The semiconductor structure of example embodiment 1, 2, 3 or 4, further including a first local interconnect disposed over the first gate structure, wherein the first plurality of semiconductor fins is of a first semiconductor device. A second local interconnect is disposed over the second gate structure, wherein the second plurality of semiconductor fins is of a second semiconductor device different than the first semiconductor device.

Example Embodiment 6

The semiconductor structure of example embodiment 5, wherein the first local interconnect is isolated from the second local interconnect by a dielectric plug.

Example Embodiment 7

The semiconductor structure of example embodiment 1, 2, 3, 4, 5 or 6, wherein the gate edge isolation structure is disposed in a recess below the uppermost surface of the trench isolation layer and extends above an uppermost surface of the first and second gate structures.

Example Embodiment 8

The semiconductor structure of example embodiment 1, 2, 3, 4, 5, 6 or 7, wherein the gate edge isolation structure includes a lower dielectric portion and a dielectric cap on the lower dielectric portion.

Example Embodiment 9

The semiconductor structure of example embodiment 1, 2, 3, 4, 5, 6, 7 or 8, wherein the gate edge isolation structure includes a vertical seam centered within the gate edge isolation structure.

Example Embodiment 10

A semiconductor structure includes an I/O device having a first plurality of semiconductor fins disposed above a substrate and protruding through an uppermost surface of a trench isolation layer. A logic device having a second plurality of semiconductor fins is disposed above the substrate and protrudes through the uppermost surface of the trench isolation layer. A gate edge isolation structure is disposed between the I/O device and the logic device. A semiconductor fin of the first plurality of semiconductor fins closest to the gate edge isolation structure is spaced farther from the gate edge isolation structure than a semiconductor fin of the second plurality of semiconductor fins closest to the gate edge isolation structure.

Example Embodiment 11

The semiconductor structure of example embodiment 10, wherein the gate edge isolation structure is disposed in a recess below the uppermost surface of the trench isolation layer.

Example Embodiment 12

The semiconductor structure of example embodiment 10 or 11, wherein the gate edge isolation structure includes a lower dielectric portion and a dielectric cap on the lower dielectric portion.

Example Embodiment 13

The semiconductor structure of example embodiment 10, 11 or 12, wherein the gate edge isolation structure includes a vertical seam centered within the gate edge isolation structure.

Example Embodiment 14

A semiconductor structure includes an I/O region having a first plurality of semiconductor fins disposed above a substrate and protruding through an uppermost surface of a trench isolation layer. The semiconductor structure also includes a logic region having a first logic device and a second logic device. The first logic device has a second plurality of semiconductor fins disposed above the substrate and protruding through the uppermost surface of the trench isolation layer, and the second logic device has a third plurality of semiconductor fins disposed above the substrate and protruding through the uppermost surface of the trench isolation layer. A first gate edge isolation structure is disposed between the I/O region and the first logic device of the logic region. A semiconductor fin of the first plurality of semiconductor fins of the I/O region closest to a first side of the first gate edge isolation structure is spaced farther from the first gate edge isolation structure than a semiconductor fin of the second plurality of semiconductor fins of the first logic device closest to a second side of the first gate edge isolation structure. A second gate edge isolation structure is disposed between the first logic device of the logic region and the second logic device of the logic region. The second gate edge isolation structure is wider than the first gate edge isolation structure.

Example Embodiment 15

The semiconductor structure of example embodiment 14, wherein the first gate edge isolation structure and the second gate edge isolation structure are disposed in corresponding recesses below the uppermost surface of the trench isolation layer.

Example Embodiment 16

The semiconductor structure of example embodiment 14 or 15, wherein the first gate edge isolation structure and the second gate edge isolation structure each include a lower dielectric portion and a dielectric cap on the lower dielectric portion.

Example Embodiment 17

The semiconductor structure of example embodiment 14, 15 or 16, wherein the second gate edge isolation structure includes a vertical seam centered within the second gate edge isolation structure.

Example Embodiment 18

The semiconductor structure of example embodiment 14, 15, 16 or 17, wherein the first gate edge isolation structure has a total composition different than a total composition of the second gate edge isolation structure.

Example Embodiment 19

The semiconductor structure of example embodiment 14, 15, 16, 17 or 18, further including a local interconnect disposed on the second gate edge isolation structure and electrically coupling the first logic device and the second logic device of the logic region.

Example Embodiment 20

The semiconductor structure of example embodiment 19, wherein the local interconnect is isolated from the I/O region by a dielectric plug.

Example Embodiment 21

A semiconductor structure includes a first I/O region having a first plurality of semiconductor fins disposed above a substrate and protruding through an uppermost surface of a trench isolation layer. A second I/O region has a second plurality of semiconductor fins disposed above the substrate and protruding through an uppermost surface of the trench isolation layer. A first logic region has a third plurality of semiconductor fins disposed above the substrate and protruding through the uppermost surface of the trench isolation layer. A second logic region having a fourth plurality of semiconductor fins disposed above the substrate and protruding through the uppermost surface of the trench isolation layer. A gate edge isolation structure has a first portion separating the first I/O region from the second I/O region and a second portion separating the first logic region from the second logic region. The first portion is continuous with the second portion. The first portion has a width between the first I/O region from the second I/O region smaller than a width of the second portion between the first logic region from the second logic region.

Example Embodiment 22

The semiconductor structure of example embodiment 21, wherein the gate edge isolation structure is disposed in a recess below the uppermost surface of the trench isolation layer.

Example Embodiment 23

The semiconductor structure of example embodiment 21 or 22, wherein the gate edge isolation structure includes a lower dielectric portion and a dielectric cap on the lower dielectric portion.

Example Embodiment 24

The semiconductor structure of example embodiment 21, 22 or 23, wherein the gate edge isolation structure includes a vertical seam centered within the gate edge isolation structure.

What is claimed is:

1. A semiconductor structure, comprising:
   a first plurality of semiconductor fins disposed above a substrate and protruding through an uppermost surface of a trench isolation layer;
   a first gate structure disposed over the first plurality of semiconductor fins, the first gate structure defining a channel region in each of the first plurality of semiconductor fins and source and drain regions on opposing ends of the channel regions of each of the first plurality of semiconductor fins;
   a second plurality of semiconductor fins disposed above the substrate and protruding through the uppermost surface of the trench isolation layer;
   a second gate structure disposed over the second plurality of semiconductor fins, the second gate structure defining a channel region in each of the second plurality of semiconductor fins and source and drain regions on opposing ends of the channel regions of each of the second plurality of semiconductor fins; and
   a gate edge isolation structure disposed between and in contact with the first gate structure and the second gate structure, wherein a semiconductor fin of the first plurality of semiconductor fins closest to the gate edge isolation structure is spaced farther from the gate edge isolation structure than a semiconductor fin of the second plurality of semiconductor fins closest to the gate edge isolation structure, wherein the first gate stack comprises a first gate dielectric, the first gate dielectric conformal with the first plurality of semiconductor fins and having a first dielectric layer along and in contact with a first side of the gate edge isolation structure, and wherein the second gate stack comprises a second gate dielectric, the second gate dielectric conformal with the second plurality of semiconductor fins and having a second dielectric layer along and in contact with a second side of the gate edge isolation structure opposite the first side of the gate edge isolation structure.

2. The semiconductor structure of claim 1, wherein the first gate dielectric is thicker than the second gate dielectric.

3. The semiconductor structure of claim 1, wherein the first gate dielectric has more dielectric layers than the second gate dielectric.

4. The semiconductor structure of claim 1, further comprising:
   a first local interconnect disposed over the first gate structure, wherein the first plurality of semiconductor fins is of a first semiconductor device; and
   a second local interconnect disposed over the second gate structure, wherein the second plurality of semiconductor fins is of a second semiconductor device different than the first semiconductor device.

5. The semiconductor structure of claim 4, wherein the first local interconnect is isolated from the second local interconnect by a dielectric plug.

6. The semiconductor structure of claim 1, wherein the gate edge isolation structure is disposed in a recess below the uppermost surface of the trench isolation layer and extends above an uppermost surface of the first and second gate structures.

7. The semiconductor structure of claim 1, wherein the gate edge isolation structure comprises a lower dielectric portion and a dielectric cap on the lower dielectric portion.

8. The semiconductor structure of claim 1, wherein the gate edge isolation structure comprises a vertical seam centered within the gate edge isolation structure.

9. A semiconductor structure, comprising:
   an I/O device having a first plurality of semiconductor fins disposed above a substrate and protruding through an uppermost surface of a trench isolation layer;
   a logic device having a second plurality of semiconductor fins disposed above the substrate and protruding through the uppermost surface of the trench isolation layer; and
   a gate edge isolation structure disposed between the I/O device and the logic device, wherein a semiconductor fin of the first plurality of semiconductor fins closest to the gate edge isolation structure is spaced farther from the gate edge isolation structure than a semiconductor fin of the second plurality of semiconductor fins closest to the gate edge isolation structure, wherein the I/O device comprises a first gate stack comprising a first gate dielectric, the first gate dielectric conformal with the first plurality of semiconductor fins and having a first dielectric layer along and in contact with a first side of the gate edge isolation structure, and wherein the logic device comprises a second gate stack comprising a second gate dielectric, the second gate dielectric conformal with the second plurality of semiconductor fins and having a second dielectric layer along and in contact with a second side of the gate edge isolation structure opposite the first side of the gate edge isolation structure.

10. The semiconductor structure of claim 9, wherein the gate edge isolation structure is disposed in a recess below the uppermost surface of the trench isolation layer.

11. The semiconductor structure of claim 9, wherein the gate edge isolation structure comprises a lower dielectric portion and a dielectric cap on the lower dielectric portion.

12. The semiconductor structure of claim 9, wherein the gate edge isolation structure comprises a vertical seam centered within the gate edge isolation structure.

13. A semiconductor structure, comprising:
an I/O region having a first plurality of semiconductor fins disposed above a substrate and protruding through an uppermost surface of a trench isolation layer;
a logic region having a first logic device and a second logic device, the first logic device having a second plurality of semiconductor fins disposed above the substrate and protruding through the uppermost surface of the trench isolation layer, and the second logic device having a third plurality of semiconductor fins disposed above the substrate and protruding through the uppermost surface of the trench isolation layer;
a first gate edge isolation structure disposed between the I/O region and the first logic device of the logic region, wherein a semiconductor fin of the first plurality of semiconductor fins of the I/O region closest to a first side of the first gate edge isolation structure is spaced farther from the first gate edge isolation structure than a semiconductor fin of the second plurality of semiconductor fins of the first logic device closest to a second side of the first gate edge isolation structure; and
a second gate edge isolation structure disposed between the first logic device of the logic region and the second logic device of the logic region, wherein the second gate edge isolation structure is wider than the first gate edge isolation structure.

14. The semiconductor structure of claim 13, wherein the first gate edge isolation structure and the second gate edge isolation structure are disposed in corresponding recesses below the uppermost surface of the trench isolation layer.

15. The semiconductor structure of claim 13, wherein the first gate edge isolation structure and the second gate edge isolation structure each comprise a lower dielectric portion and a dielectric cap on the lower dielectric portion.

16. The semiconductor structure of claim 13, wherein the second gate edge isolation structure comprises a vertical seam centered within the second gate edge isolation structure.

17. The semiconductor structure of claim 13, wherein the first gate edge isolation structure has a total composition different than a total composition of the second gate edge isolation structure.

18. The semiconductor structure of claim 13, further comprising: a local interconnect disposed on the second gate edge isolation structure and electrically coupling the first logic device and the second logic device of the logic region.

19. The semiconductor structure of claim 18, wherein the local interconnect is isolated from the I/O region by a dielectric plug.

20. A semiconductor structure, comprising:
a first I/O region having a first plurality of semiconductor fins disposed above a substrate and protruding through an uppermost surface of a trench isolation layer;
a second I/O region having a second plurality of semiconductor fins disposed above the substrate and protruding through an uppermost surface of the trench isolation layer;
a first logic region having a third plurality of semiconductor fins disposed above the substrate and protruding through the uppermost surface of the trench isolation layer;
a second logic region having a fourth plurality of semiconductor fins disposed above the substrate and protruding through the uppermost surface of the trench isolation layer; and
a gate edge isolation structure having a first portion separating the first I/O region from the second I/O region and a second portion separating the first logic region from the second logic region, wherein the first portion is continuous with the second portion, and wherein the first portion has a width between the first I/O region from the second I/O region smaller than a width of the second portion between the first logic region from the second logic region.

21. The semiconductor structure of claim 20, wherein the gate edge isolation structure is disposed in a recess below the uppermost surface of the trench isolation layer.

22. The semiconductor structure of claim 20, wherein the gate edge isolation structure comprises a lower dielectric portion and a dielectric cap on the lower dielectric portion.

23. The semiconductor structure of claim 20, wherein the gate edge isolation structure comprises a vertical seam centered within the gate edge isolation structure.

24. A semiconductor structure, comprising:
a first plurality of semiconductor fins disposed above a substrate and protruding through an uppermost surface of a trench isolation layer;
a first gate structure disposed over the first plurality of semiconductor fins, the first gate structure defining a channel region in each of the first plurality of semiconductor fins and source and drain regions on opposing ends of the channel regions of each of the first plurality of semiconductor fins;
a second plurality of semiconductor fins disposed above the substrate and protruding through the uppermost surface of the trench isolation layer;
a second gate structure disposed over the second plurality of semiconductor fins, the second gate structure defining a channel region in each of the second plurality of semiconductor fins and source and drain regions on opposing ends of the channel regions of each of the second plurality of semiconductor fins;
a gate edge isolation structure disposed between and in contact with the first gate structure and the second gate structure, wherein a semiconductor fin of the first plurality of semiconductor fins closest to the gate edge isolation structure is spaced farther from the gate edge isolation structure than a semiconductor fin of the second plurality of semiconductor fins closest to the gate edge isolation structure;
a first local interconnect disposed over the first gate structure, wherein the first plurality of semiconductor fins is of a first semiconductor device; and a second local interconnect disposed over the second gate structure, wherein the second plurality of semiconductor fins is of a second semiconductor device different than the first semiconductor device, wherein the first local interconnect is isolated from the second local interconnect by a dielectric plug.

25. A semiconductor structure, comprising:

a first plurality of semiconductor fins disposed above a substrate and protruding through an uppermost surface of a trench isolation layer;

a first gate structure disposed over the first plurality of semiconductor fins, the first gate structure defining a channel region in each of the first plurality of semiconductor fins and source and drain regions on opposing ends of the channel regions of each of the first plurality of semiconductor fins;

a second plurality of semiconductor fins disposed above the substrate and protruding through the uppermost surface of the trench isolation layer;

a second gate structure disposed over the second plurality of semiconductor fins, the second gate structure defining a channel region in each of the second plurality of semiconductor fins and source and drain regions on opposing ends of the channel regions of each of the second plurality of semiconductor fins; and a gate edge isolation structure disposed between and in contact with the first gate structure and the second gate structure, wherein a semiconductor fin of the first plurality of semiconductor fins closest to the gate edge isolation structure is spaced farther from the gate edge isolation structure than a semiconductor fin of the second plurality of semiconductor fins closest to the gate edge isolation structure, wherein the gate edge isolation structure is disposed in a recess below the uppermost surface of the trench isolation layer and extends above an uppermost surface of the first and second gate structures.

26. A semiconductor structure, comprising:

a first plurality of semiconductor fins disposed above a substrate and protruding through an uppermost surface of a trench isolation layer;

a first gate structure disposed over the first plurality of semiconductor fins, the first gate structure defining a channel region in each of the first plurality of semiconductor fins and source and drain regions on opposing ends of the channel regions of each of the first plurality of semiconductor fins;

a second plurality of semiconductor fins disposed above the substrate and protruding through the uppermost surface of the trench isolation layer;

a second gate structure disposed over the second plurality of semiconductor fins, the second gate structure defining a channel region in each of the second plurality of semiconductor fins and source and drain regions on opposing ends of the channel regions of each of the second plurality of semiconductor fins; and a gate edge isolation structure disposed between and in contact with the first gate structure and the second gate structure, wherein a semiconductor fin of the first plurality of semiconductor fins closest to the gate edge isolation structure is spaced farther from the gate edge isolation structure than a semiconductor fin of the second plurality of semiconductor fins closest to the gate edge isolation structure, wherein the gate edge isolation structure comprises a lower dielectric portion and a dielectric cap on the lower dielectric portion.

27. A semiconductor structure, comprising:

a first plurality of semiconductor fins disposed above a substrate and protruding through an uppermost surface of a trench isolation layer;

a first gate structure disposed over the first plurality of semiconductor fins, the first gate structure defining a channel region in each of the first plurality of semiconductor fins and source and drain regions on opposing ends of the channel regions of each of the first plurality of semiconductor fins;

a second plurality of semiconductor fins disposed above the substrate and protruding through the uppermost surface of the trench isolation layer;

a second gate structure disposed over the second plurality of semiconductor fins, the second gate structure defining a channel region in each of the second plurality of semiconductor fins and source and drain regions on opposing ends of the channel regions of each of the second plurality of semiconductor fins; and a gate edge isolation structure disposed between and in contact with the first gate structure and the second gate structure, wherein a semiconductor fin of the first plurality of semiconductor fins closest to the gate edge isolation structure is spaced farther from the gate edge isolation structure than a semiconductor fin of the second plurality of semiconductor fins closest to the gate edge isolation structure, wherein the gate edge isolation structure comprises a vertical seam centered within the gate edge isolation structure.

\* \* \* \* \*